(12) United States Patent
Teig et al.

(10) Patent No.: US 7,669,097 B1
(45) Date of Patent: Feb. 23, 2010

(54) CONFIGURABLE IC WITH ERROR DETECTION AND CORRECTION CIRCUITRY

(75) Inventors: Steven Teig, Menlo Park, CA (US); Jason Redgrave, Mountain View, CA (US)

(73) Assignee: Tabula, Inc., Santa Clara, CA (US)

( * ) Notice: Subject to any disclaimer, the term of this patent is extended or adjusted under 35 U.S.C. 154(b) by 331 days.

(21) Appl. No.: 11/391,000

(22) Filed: Mar. 27, 2006

(51) Int. Cl.
*G01R 31/28* (2006.01)

(52) U.S. Cl. ........................................ 714/725
(58) Field of Classification Search ................ 714/725
See application file for complete search history.

(56) References Cited

U.S. PATENT DOCUMENTS

| | | | |
|---|---|---|---|
| 4,873,459 A | 10/1989 | El Gamal et al. | |
| 5,245,575 A | 9/1993 | Sasaki et al. | |
| 5,325,329 A | 6/1994 | Inoue et al. | |
| 5,349,250 A | 9/1994 | New | |
| 5,357,153 A | 10/1994 | Chiang et al. | |
| 5,365,125 A | 11/1994 | Goetting et al. | |
| 5,369,622 A | 11/1994 | McLaury | |
| 5,371,708 A | 12/1994 | Kobayashi | |
| 5,426,378 A | 6/1995 | Ong | |
| 5,521,835 A | 5/1996 | Trimberger | |
| 5,532,958 A | 7/1996 | Jiang et al. | |
| 5,552,721 A | 9/1996 | Gould | |
| 5,581,500 A | 12/1996 | D'Souza | |
| 5,600,263 A | 2/1997 | Trimberger et al. | |
| 5,610,829 A | 3/1997 | Trimberger | |
| 5,629,637 A | 5/1997 | Trimberger et al. | |
| 5,631,578 A | 5/1997 | Clinton et al. | |
| 5,640,106 A | 6/1997 | Erickson et al. | |
| 5,646,544 A | 7/1997 | Iadanza | |
| 5,646,545 A | 7/1997 | Trimberger et al. | |
| 5,659,484 A | 8/1997 | Bennett et al. | |
| 5,682,107 A | 10/1997 | Tavana et al. | |
| 5,692,147 A | 11/1997 | Larsen et al. | |
| 5,694,057 A | 12/1997 | Gould | |
| 5,701,441 A | 12/1997 | Trimberger | |
| 5,719,889 A | 2/1998 | Iadanza | |
| 5,732,246 A | 3/1998 | Gould et al. | |
| 5,734,622 A | 3/1998 | Furumochi et al. | |
| 5,737,235 A | 4/1998 | Kean et al. | |
| 5,745,422 A | 4/1998 | Iadanza | |
| 5,745,734 A | 4/1998 | Craft et al. | |

(Continued)

OTHER PUBLICATIONS

Trimberger, S., "Effects of FPGA Architecture on FPGA Routing," 32nd ACM/IEEE Design Automation Conference, Jun. 1995, ACM.

(Continued)

*Primary Examiner*—James C Kerveros
(74) *Attorney, Agent, or Firm*—Adeli & Tollen LLP

(57) ABSTRACT

A configurable integrated circuit (IC) performs error detection and correction on configuration data. The IC includes a configuration memory for storing configuration data, an error detection circuitry for detecting an error and a circuit that outputs from the IC an uncorrectable error signal indicating the detection of an error. The configurable IC has a circuit inside of the IC that causes the IC to reset when the error circuitry detects an uncorrectable error. In another embodiment, the circuit that causes the IC to reset is located outside of the IC.

22 Claims, 13 Drawing Sheets

U.S. PATENT DOCUMENTS

| | | | |
|---|---|---|---|
| 5,760,602 | A | 6/1998 | Tan |
| 5,761,483 | A | 6/1998 | Trimberger |
| 5,764,954 | A | 6/1998 | Fuller et al. |
| 5,768,178 | A | 6/1998 | McLaury |
| 5,777,360 | A | 7/1998 | Rostoker et al. |
| 5,802,003 | A | 9/1998 | Iadanza et al. |
| 5,815,726 | A | 9/1998 | Cliff |
| 5,825,662 | A | 10/1998 | Trimberger |
| 5,889,411 | A | 3/1999 | Chaudhary |
| 5,914,616 | A | 6/1999 | Young et al. |
| 5,914,906 | A | 6/1999 | Iadanza et al. |
| 5,944,813 | A | 8/1999 | Trimberger |
| 5,982,655 | A | 11/1999 | Doyle |
| 5,991,191 | A | 11/1999 | Rao |
| 6,002,991 | A | 12/1999 | Conn, Jr. |
| 6,023,421 | A | 2/2000 | Clinton et al. |
| 6,038,192 | A | 3/2000 | Clinton et al. |
| 6,044,031 | A | 3/2000 | Iadanza et al. |
| 6,054,873 | A | 4/2000 | Laramie |
| 6,069,490 | A | 5/2000 | Ochotta et al. |
| 6,075,745 | A | 6/2000 | Gould et al. |
| 6,084,429 | A | 7/2000 | Trimberger |
| 6,086,631 | A | 7/2000 | Chaudhary et al. |
| 6,091,263 | A | 7/2000 | New et al. |
| 6,091,645 | A | 7/2000 | Iadanza |
| 6,107,821 | A | 8/2000 | Kelem et al. |
| 6,110,223 | A | 8/2000 | Southgate et al. |
| 6,111,779 | A | 8/2000 | You |
| 6,118,707 | A | 9/2000 | Gould et al. |
| 6,130,854 | A | 10/2000 | Gould et al. |
| 6,134,154 | A | 10/2000 | Iwaki et al. |
| 6,140,839 | A | 10/2000 | Kaviani et al. |
| 6,150,838 | A | 11/2000 | Wittig et al. |
| 6,163,168 | A | 12/2000 | Nguyen et al. |
| 6,172,521 | B1 | 1/2001 | Motomura |
| 6,173,379 | B1 | 1/2001 | Poplingher et al. |
| 6,175,247 | B1 | 1/2001 | Scalera et al. |
| 6,184,707 | B1 | 2/2001 | Norman et al. |
| 6,184,709 | B1 | 2/2001 | New |
| 6,205,076 | B1 | 3/2001 | Wakayama et al. |
| 6,229,337 | B1 | 5/2001 | Xiao et al. |
| 6,233,191 | B1 | 5/2001 | Gould et al. |
| 6,255,849 | B1 | 7/2001 | Mohan |
| 6,275,064 | B1 | 8/2001 | Agrawal et al. |
| 6,292,019 | B1 | 9/2001 | New et al. |
| 6,326,651 | B1 | 12/2001 | Manabe |
| 6,326,807 | B1 | 12/2001 | Veenstra et al. |
| 6,346,824 | B1 | 2/2002 | New |
| 6,348,813 | B1 | 2/2002 | Agrawal et al. |
| 6,381,732 | B1 | 4/2002 | Burnham et al. |
| 6,404,224 | B1 | 6/2002 | Azegami et al. |
| 6,411,128 | B2 | 6/2002 | Maeda |
| 6,430,736 | B1 | 8/2002 | Levi et al. |
| 6,469,540 | B2 | 10/2002 | Nakaya |
| 6,469,553 | B1 | 10/2002 | Sung et al. |
| 6,480,954 | B2 | 11/2002 | Trimberger |
| 6,487,709 | B1 | 11/2002 | Keller et al. |
| 6,490,707 | B1 | 12/2002 | Baxter |
| 6,496,918 | B1 | 12/2002 | Dehon et al. |
| 6,515,509 | B1 | 2/2003 | Baxter |
| 6,526,559 | B2 | 2/2003 | Schiefele et al. |
| 6,529,040 | B1 | 3/2003 | Carberry et al. |
| 6,545,501 | B1 | 4/2003 | Bailis et al. |
| 6,560,139 | B2 | 5/2003 | Ma et al. |
| 6,593,771 | B2 | 7/2003 | Bailis et al. |
| 6,601,227 | B1 | 7/2003 | Trimberger |
| 6,603,330 | B1 | 8/2003 | Snyder |
| 6,629,308 | B1 | 9/2003 | Baxter |
| 6,636,070 | B1 | 10/2003 | Altaf |
| 6,642,744 | B2 | 11/2003 | Or-Bach et al. |
| 6,643,173 | B2 | 11/2003 | Takemura |
| 6,650,142 | B1 | 11/2003 | Agrawal et al. |
| 6,667,635 | B1 | 12/2003 | Pi et al. |
| 6,668,361 | B2 | 12/2003 | Bailis et al. |
| 6,675,309 | B1 | 1/2004 | Baxter |
| 6,686,769 | B1 | 2/2004 | Nguyen et al. |
| 6,703,861 | B2 | 3/2004 | Ting |
| 6,714,041 | B1 | 3/2004 | Darling et al. |
| 6,717,436 | B2 | 4/2004 | Kress et al. |
| 6,724,648 | B2 | 4/2004 | Khellah et al. |
| 6,732,068 | B2 | 5/2004 | Sample et al. |
| 6,798,688 | B2 | 9/2004 | Joshi |
| 6,806,730 | B2 | 10/2004 | Bailis et al. |
| 6,809,979 | B1 | 10/2004 | Tang |
| 6,810,442 | B1 | 10/2004 | Lin et al. |
| 6,829,756 | B1 | 12/2004 | Trimberger |
| 6,831,479 | B2 | 12/2004 | Lo |
| 6,838,902 | B1 | 1/2005 | Elftmann et al. |
| 6,894,527 | B1 | 5/2005 | Donlin et al. |
| 6,903,575 | B1 | 6/2005 | Davidson et al. |
| 6,903,962 | B2 | 6/2005 | Nii |
| 6,920,627 | B2 | 7/2005 | Blodget et al. |
| 6,924,663 | B2 | 8/2005 | Masui et al. |
| 6,925,025 | B2 | 8/2005 | Deng et al. |
| 6,937,535 | B2 | 8/2005 | Ahn et al. |
| 6,956,399 | B1 | 10/2005 | Bauer |
| 6,970,374 | B2 | 11/2005 | Lin |
| 6,992,505 | B1 | 1/2006 | Zhou |
| 6,998,872 | B1 | 2/2006 | Chirania et al. |
| 7,010,667 | B2 | 3/2006 | Vorbach et al. |
| 7,027,346 | B2 | 4/2006 | Houston et al. |
| 7,028,281 | B1 | 4/2006 | Agrawal et al. |
| 7,030,651 | B2 | 4/2006 | Madurawe |
| 7,061,941 | B1 | 6/2006 | Zheng |
| 7,064,577 | B1 | 6/2006 | Lee |
| 7,075,333 | B1 | 7/2006 | Chaudhary et al. |
| 7,088,136 | B1 | 8/2006 | Lewis |
| 7,107,568 | B2 | 9/2006 | Cronquist |
| 7,109,752 | B1 | 9/2006 | Schmit et al. |
| 7,110,317 | B2 | 9/2006 | Song et al. |
| 7,112,992 | B1 | 9/2006 | Guzman et al. |
| 7,113,421 | B2 | 9/2006 | Maeda et al. |
| 7,126,372 | B2 | 10/2006 | Vadi et al. |
| 7,126,856 | B2 | 10/2006 | Sun et al. |
| 7,129,746 | B1 | 10/2006 | Balasubramanian |
| 7,135,886 | B2 | 11/2006 | Schlacter |
| 7,138,827 | B1 | 11/2006 | Trimberger |
| 7,143,329 | B1 * | 11/2006 | Trimberger et al. ......... 714/746 |
| 7,145,829 | B1 | 12/2006 | Kim et al. |
| 7,154,299 | B2 | 12/2006 | Swami et al. |
| 7,167,025 | B1 | 1/2007 | Schmit et al. |
| 7,193,440 | B1 | 3/2007 | Schmit et al. |
| 7,200,235 | B1 * | 4/2007 | Trimberger ................. 380/277 |
| 7,209,404 | B2 | 4/2007 | Chen et al. |
| 7,212,448 | B1 | 5/2007 | Trimberger |
| 7,224,182 | B1 | 5/2007 | Hutchings et al. |
| 7,230,869 | B1 | 6/2007 | Redgrave et al. |
| 7,236,009 | B1 | 6/2007 | Rohe et al. |
| 7,268,586 | B1 | 9/2007 | Redgrave |
| 7,272,031 | B1 | 9/2007 | Redgrave |
| 7,295,037 | B2 | 11/2007 | Schmit et al. |
| 7,304,904 | B2 | 12/2007 | Lambrache et al. |
| 7,310,757 | B2 * | 12/2007 | Ngo et al. .................... 714/725 |
| 7,325,179 | B2 * | 1/2008 | Sasakura .................... 714/718 |
| 7,328,384 | B1 * | 2/2008 | Kulkarni et al. ............. 714/725 |
| 7,330,050 | B2 | 2/2008 | Redgrave |
| 7,425,841 | B2 | 9/2008 | Schmit et al. |
| 2001/0007428 | A1 | 7/2001 | Young et al. |
| 2001/0038552 | A1 | 11/2001 | Ishimaru |
| 2002/0008541 | A1 | 1/2002 | Young et al. |
| 2002/0010853 | A1 | 1/2002 | Trimberger et al. |
| 2002/0113619 | A1 | 8/2002 | Wong |
| 2002/0125910 | A1 | 9/2002 | New et al. |
| 2002/0125914 | A1 | 9/2002 | Kim |

| | | |
|---|---|---|
| 2002/0161568 A1 | 10/2002 | Sample et al. |
| 2002/0163357 A1 | 11/2002 | Ting |
| 2003/0042931 A1 | 3/2003 | Ting |
| 2003/0080777 A1 | 5/2003 | Baxter |
| 2003/0110430 A1 | 6/2003 | Bailis et al. |
| 2004/0010767 A1 | 1/2004 | Agrawal et al. |
| 2004/0103265 A1 | 5/2004 | Smith |
| 2004/0105207 A1 | 6/2004 | Spaderna et al. |
| 2004/0196066 A1 | 10/2004 | Ting |
| 2004/0222817 A1 | 11/2004 | Madurawe |
| 2004/0233758 A1 | 11/2004 | Kim et al. |
| 2005/0128789 A1 | 6/2005 | Houston |
| 2005/0134308 A1 | 6/2005 | Okada et al. |
| 2005/0254315 A1 | 11/2005 | Salters |
| 2006/0250168 A1 | 11/2006 | Starr et al. |
| 2007/0075737 A1 | 4/2007 | Schmit et al. |
| 2007/0143577 A1 | 6/2007 | Smith |
| 2007/0241777 A1 | 10/2007 | Schmit et al. |
| 2007/0241791 A1 | 10/2007 | Schmit et al. |
| 2007/0242529 A1 | 10/2007 | Redgrave et al. |
| 2007/0257700 A1 | 11/2007 | Caldwell et al. |
| 2007/0257702 A1 | 11/2007 | Hutchings et al. |
| 2007/0285125 A1 | 12/2007 | Redgrave |
| 2007/0286008 A1 | 12/2007 | Redgrave |
| 2008/0164906 A1 | 7/2008 | Redgrave |

OTHER PUBLICATIONS

Notice of Allowance of U.S. Appl. No. 10/883,486, mailing date May 2, 2008, Schmit, Herman, et al.
Notice of Allowance of U.S. Appl. No. 10/883,486, mailing date Nov. 5, 2007, Schmit, Herman, et al.
Final Office Action of U.S. Appl. No. 10/883,486, mailing date Jul. 12, 2007, Schmit, Herman, et al.
Advisory Action of U.S. Appl. No. 10/883,486, mailing date Jan. 5, 2007, Schmit, Herman, et al.
Final Office Action of U.S. Appl. No. 10/883,486, mailing date Oct. 4, 2006, Schmit, Herman, et al.
Non-Final Office Action of U.S. Appl. No. 10/883,486, mailing date Feb. 10, 2006, Schmit, Herman, et al.
U.S. Appl. No. 12/200,867, filed Aug. 28, 2008, Schmit, Herman, et al.
Notice of Allowance of U.S. Appl. No. 10/882,946, mailing date Sep. 28, 2006, Schmit, Herman, et al.
Final Office Action of U.S. Appl. No. 10/882,946, mailing date Jun. 5, 2006, Schmit, Herman, et al.
Non-Final Office Action of U.S. Appl. No. 10/882,946, mailing date Oct. 26, 2005, Schmit, Herman, et al.
Non-Final Office Action of U.S. Appl. No. 11/617,671, mailing date Oct. 3, 2008, Schmit, Herman, et al.
Final Office Action of U.S. Appl. No. 11/617,671, mailing date Mar. 31, 2008, Schmit, Herman, et al.
Non-Final Office Action of U.S. Appl. No. 11/617,671, mailing date Aug. 15, 2007, Schmit, Herman, et al.
Notice of Allowance of U.S. Appl. No. 10/883,051, mailing date Sep. 7, 2006, Schmit, Herman, et al.
Final Office Action of U.S. Appl. No. 10/883,051, mailing date Apr. 3, 2006, Schmit, Herman, et al.
Non-Final Office Action of U.S. Appl. No. 10/883,051, mailing date Oct. 26, 2005, Schmit, Herman, et al.
Non-Final Office Action of U.S. Appl. No. 11/608,790, mailing date Mar. 21, 2008, Schmit, Herman, et al.
U.S. Appl. No. 12/058,662, filed Mar. 28, 2008, Caldwell, Andrew, et al.
Notice of Allowance of U.S. Appl. No. 11/081,874, mailing date May 8, 2007, Redgrave, Jason.
Final Office Action of U.S. Appl. No. 11/081,874, mailing date Nov. 27, 2006, Redgrave, Jason.
Non-Final Office Action of U.S. Appl. No. 11/081,874, mailing date Apr. 19, 2006, Redgrave, Jason.
Final Office Action of U.S. Appl. No. 11/845,028, mailing date Aug. 29, 2008, Redgrave, Jason.
Non-Final Office Action of U.S. Appl. No. 11/845,028, mailing date Jan. 24, 2008, Redgrave, Jason.
Notice of Allowance of U.S. Appl. No. 11/081,870, mailing date Jan. 26, 2007, Redgrave, Jason, et al.
Final Office Action of U.S. Appl. No. 11/081,870, mailing date Oct. 6, 2006, Redgrave, Jason, et al.
Non-Final Office Action of U.S. Appl. No. 11/081,870, mailing date May 9, 2006, Redgrave, Jason, et al.
Final Office Action of U.S. Appl. No. 11/745,442, mailing date Aug. 11, 2008, Redgrave, Jason, et al.
Non-Final Office Action of U.S. Appl. No. 11/745,442, mailing date Dec. 28, 2007, Redgrave, Jason, et al.
Notice of Allowance of U.S. Appl. No. 11/082,230, mailing date Apr. 2, 2007, Redgrave, Jason.
Non-Final Office Action of U.S. Appl. No. 11/082,230, mailing date Oct. 3, 2006, Redgrave, Jason.
Restriction Requirement of U.S. Appl. No. 11/781,224, mailing date Aug. 6, 2008, Redgrave, Jason.
Notice of Allowance of U.S. Appl. No. 11/082,203, mailing date Sep. 6, 2007, Redgrave, Jason.
Notice of Allowance of U.S. Appl. No. 11/082,203, mailing date May 3, 2007, Redgrave, Jason.
Non-Final Office Action of U.S. Appl. No. 11/082,203, mailing date Jan. 5, 2007, Redgrave, Jason.
U.S. Appl. No. 11/390,973, filed Mar. 27, 2006, Teig, Steven, et al.
Non-Final Office Action of U.S. Appl. No. 11/390,973, mailing date Jun. 27, 2008, Teig, Steven, et al.
U.S. Appl. No. 11/754,262, filed May 25, 2007, Redgrave, Jason, et al.
U.S. Appl. No. 11/754,263, filed May 25, 2007, Teig, Steven, et al.
Non-Final Office Action of U.S. Appl. No. 11/754,263, mailing date Jun. 25, 2008, Teig, Steven, et al.
U.S. Appl. No. 11/754,264, filed May 25, 2007, Caldwell, Andrew, et al.
"§3 Programmable Logic Devices," *Digital System Design*, 2001 Month N/A, slides 3.1-3.28.
"Design for Low Power in Actel Antifuse FPGAs", Actel Application Note, 2000 Actel Corporation, Sep. 2000, pp. 1-8.
"The Effect of SRAM Table Sharing and Cluster Size on FPGA Area", pp. 1-10.
"The Xilinx Virtex Series FPGA," Jan. 22, 2001, slides 1-22.
"Unifying Sequential and Spatial Computing with a Single Instruction Set Architecture," *ISCA '04*, Jun. 19-23, 2004, ACM, Munchen, Oberbayern, Germany.
Agrawal, O., et al., "An Innovative, Segmented High Performance FPGA Family with Variable-Grain-Architecture and Wide-gating Functions," *FPGA 99*, Feb. 1999, pp. 17-26, ACM, Monterey, CA.
Ahmed, E., et al., "The Effect of LUT and Cluster Size on Deep-Submicron FPGA Performance and Density," *FPGA 2000*, Feb. 2000, ACM, Monterey, CA.
Altera Corp., "6. DSP Blocks in Stratix II Devices," *SII52006-1.0*, Feb. 2004, pp. 1-32.
Altera, "Stratix II DSP Performance," *White Paper*, Feb. 2004, pp. 1-9, ver. 1.0, Altera Corporation, San Jose, CA.
Amerson, R., et al., "Plasma: An FPGA for Million Gate Systems," *Proceedings of the 1996 ACM 4th International Symposium on FPGAs*, Feb. 11-13, 1996, pp. 10-16, Monterey, CA.
Backus, J., "Can Programming be Liberated from the Von Neumann Style? A Functional Style and its Algebra of Programs," *Communications of the ACM*, Aug. 1978, pp. 613-641, vol. 21, No. 8, ACM.
Barker, R., "QuickSilver ACM SilverStream Design Methodology with the Inspire SDK Tool Set," *A Technology Application Whitepaper*, Jan. 26, 2004, pp. 1-8, QuickSilver Technology, Inc., San Jose, CA.
Butts, M., "Future Directions of Dynamically Reprogrammable Systems," *IEEE 1995 Custom Integrated Circuits Conference*, May 1995, pp. 487-494, IEEE.
Camposano, R., "The Growing Semiconductor Zoo: ASICs, CSSP, ASSP, ASIP, Structured Arrays, FPGAs, Processor Arrays, Platforms . . . and Other Animalia," Aug. 29, 2003, pp. 1-74, Synopsys, Inc.
Caspi, E., et al., "A Streaming Multi-Threaded Model," *MSP-3*, Dec. 2, 2001, pp. 1-23.

Caspi, E., et al., "Stream Computations Organized for Reconfigurable Execution (SCORE): Introduction and Tutorial," Aug. 25, 2000, pp. 1-31, Version 1.0.

Compton, K., et al., "An Introduction to Reconfigurable Computing," *IEEE Computer*, Apr. 2000.

Compton, K., et al., "Reconfigurable Computing: A Survey of Systems and Software," *ACM Computing Surveys*, Jun. 2002, pp. 171-210, vol. 34, No. 2, ACM, New York, NY.

Cong, J., et al., "Combinational Logic Synthesis for LUT Based Field Programmable Gate Arrays," *ACM Transactions on Design Automation of Electronic Systems*, Apr. 1996, pp. 145-204, vol. 1, No. 2, ACM, Inc.

Davare, A., et al., "The Best of Both Worlds: The Efficient Asynchronous Implementation of Synchronous Specifications," *DAC '04*, Jun. 7-11, 2004, ACM, San Diego, CA.

Dehon, A., "Balancing Interconnect and Computation in a Reconfigurable Computing Array (or, why don't you really want 100% LUT utilization)," *Proceedings of the International Symposium on Field Programmable Gate Arrays*, Feb. 1999, pp. 125-134.

Dehon, A., "DPGA Utilization and Application," *Proceedings of the 1996 ACM Fourth International Symposium on Field-Programmable Gate Arrays FPGA*, Feb. 11-13, 1996, Monterey, CA.

Dehon, A., "Dynamically Programmable Gate Arrays: A Step Toward Increased Computational Density," *Proceedings of the Fourth Canadian Workshop on Field-Programmable Devices*, May 1996, pp. 47-54.

Dehon, A., "Reconfigurable Architectures for General-Purpose Computing," *A.I. Technical Report No. 1586*, Oct. 1996, pp. i-353.

Dehon, A., "The Density Advantage of Configurable Computing," Apr. 2000, pp. 41-49, IEEE.

Dehon, A., "Transit Note #121: Notes on Programmable Interconnect," *M.I.T. Transit Project*, Feb. 1995, pp. 1-13.

Dehon, A., et al., "Design Patterns for Reconfigurable Computing," *Proceedings of the IEEE Symposium on Field-Programmable Custom Computing Machines*, Apr. 2004.

Dehon, A., et al., "DPGA-Coupled Microprocessors: Commodity ICs for the Early 21$^{st}$ Century," *FCCM '94-IEEE Workshop on FPGAs for Custom Computing Machines*, Apr. 1994, Napa Valley, CA.

Dehon, A., et al., "Reconfigurable Computing: What, Why, and Implications for Design Automation," *DAC 1999*, Jun. 1999, ACM, New Orleans, LA.

Enzler, R., et al., "Virtualizing Hardware with Multi-Context Reconfigurable Arrays," *Lecture Notes in Computer Science*, Sep. 2003, pp. 151-160.

Gayasen, A., et al., "Reducing Leakage Energy in FPGAs Using Region-Constrained Placement," *FPGA '04*, Feb. 22-24, 2004, pp. 51-58, ACM, Monterey, CA.

George, V., "Low Energy Field-Programmable Gate Array," *A Dissertation Submitted in Partial Satisfaction o the Requirements for the Degree of Doctor of Philosophy in Engineering-Electrical Engineering and Computer Sciences in the Graduate Division of the University of California, Berkeley*, Fall 2000 Month N/A, pp. 1-190.

Giraud-Carrier, C., "A Reconfigurable Data Flow Machine for Implementing Functional Programming Languages", *SIGPLAN Notices*, Sep. 1994, vol. 29, No. 9, pp. 22-28.

Goldstein, S.C., et al., "PipeRench: A Coprocessor for Streaming Multimedia Acceleration", *In International Symposium on Computer Architecture (ISCA)*, pp. 28-39, May 1999.

Goldstein, S.C., et al., "PipeRench: A Reconfigurable Architecture and Compiler," Apr. 2000, pp. 70-77, IEEE.

Hauck, S., et al., "Montage: An FPGA for Synchronous and Asynchronous Circuits," *Field-Programmable Gate Arrays: Architectures and Tools for Rapid Prototyping*, 1993 Month N/A, Springer-Verlag, Berlin.

Hauck, S., et al., "Totem: Domain-Specific Reconfigurable Logic," *IEEE Transactions on VLSI Systems*, 2006 Month N/A, pp. 1-25.

Heidari, G., et al., "Introducing a Paradigm Shift in the Design and Implementation of Wireless Devices," *A Wireless Devices Whitepaper*, Apr. 28, 2004 but © 2003, pp. 1-10, QuickSilver Technology, Inc., San Jose, CA.

Hofstee, H.P., "Cell Broadband Engine Architecture from 20,000 Feet," Aug. 24, 2005, pp. 1-6.

Huang, A.S., "Tao: An Architecturally Balanced Reconfigurable Hardware Processor," *Submitted to the Dept. of Electrical Engineering and Computer Science in Partial Fulfillment of the Requirements for the Degrees of Bachelor of Science in Electrical Science and Engineering and Master of Engineering in Electrical Engineering and Computer Science at the Massachusetts Institute of Technology*, May 23, 1997, pp. 1-86, 107-109.

IBM, "Cell Broadband Engine Architecture, Version 1.0," Aug. 8, 2005, pp. 1-319.

IBM, "SPU Application Binary Interface Specification, Version 1.3," *CBEA JSRE Series*, Aug. 1, 2005, pp. iv-26.

IBM, "SPU Assembly Language Specification, Version 1.2," *CBEA JSRE Series*, Aug. 1, 2005, pp. iii-22.

IBM, "SPU C/C++ Language Extensions, Version 2.0" *CBEA JSRE Series*, Aug. 1, 2005, pp. iv-84.

IBM, "Synergistic Processor Unit Instruction Set Architecture, Version 1.0," Aug. 1, 2005, pp. 1-257.

Kaviani, A., et al., "Computational Field Programmable Architecture," *Custom Integrated Circuits Conference, 1998, Proceedings of the IEEE 1998*, May 11-14, 1998.

Kaviani, A., et al., "Hybrid FPGA Architecture," *Proceedings of the 1996 ACM Fourth International Symposium on Field-Programmable Gate Arrays*, Feb. 11-13, 1996, pp. 3-9, Monterey, CA.

Keutzer, K., "Overview of *configurable* architectures," Feb. 28, 2002, slides 1-29.

Kocan, F., et al., "Logic Modules with Shared SRAM Tables for Field-Programmable Gate Arrays," *FPL 2004*, Aug./Sep. 2004, pp. 289-300, Springer-Verlag, Berlin Heidelberg.

Lehn, D.I., et al., "Evaluation of Rapid Context Switching on a CSRC Device," *Proceedings of the International Conference on Engineering of Reconfigurable Systems and Algorithms*, Jun. 24-27, 2002.

Lemieux, G., et al., "Generating Highly-Routable Sparse Crossbars for PLDs," *FPGA 2000*, Feb. 2000, ACM, Monterey, CA, USA.

Lemieux, G., et al., "Using Sparse Crossbars within LUT Clusters," *FPGA 2001*, Feb. 11-13, 2001, ACM, Monterey, CA.

Lertora, F., et al., "Handling Different Computational Granularity by a Reconfigurable IC Featuring Embedded FPGAs and a Network-On-Chip," *13$^{th}$ Annual IEEE Symposium on Field-Programmable Custom Computing Machines (FCCM 2005) 2005*, Apr. 18-20, 2005.

Lewis, D., et al., "The Stratix-II Routing and Logic Architecture," *Proceedings of the 2005 ACM/SIGDA 13$^{th}$ International Symposium on Field-Programmable Gate Arrays*, pp. 1-22, Feb. 20-22, 2005, Monterey, CA.

Ling, A., "The Search for the Optimal FPGA Logic Block," 2001 Month N/A, ACM.

M2000, "FlexEOS Embedded FPGA Cores," 2003 Month N/A, M2000.

Markovskiy, Y., et al., "Analysis of Quasi-Static Scheduling Techniques in a Virtualized Reconfigurable Machine," *FPGA '02*, Feb. 24-26, 2002, ACM, Monterey, CA.

Master, P., "The Next Big Leap in Reconfigurable Systems," *A Technology Vision Whitepaper*, Apr. 28, 2004 but © 2003, pp. 1-8, QuickSilver Technology, Inc., San Jose, CA.

Mathstar, Inc., "MathStar FPOA Architecture: A New Approach to High Throughput, Scalable, and Reprogrammable Design," *Technology Overview*, 2003 Month N/A, MathStar, Inc.

Mirsky, E., et al., "MATRIX: A Reconfigurable Computing Architecture with Configurable Instruction Distribution and Deployable Resources," *Proceedings of the IEEE Workshop on FPGAs for Custom Computing Machines*, Apr. 1996.

Mirsky, E., et al., "MATRIX: A Reconfigurable Computing Device with Configurable Instruction Distribution and Deployable Resources (Extended Abstract)," *Hot Chips Symposium 1997*, Aug. 1997.

Morris, K., "Lattice Launches XP: Non-Volatility at the Forefront of FPGA," *FPGA and Programmable Logic Journal*, Mar. 1, 2005, pp. 1-5, Techfocus Media, Inc.

Morris, K., "Rationalizing Reconfigurability: The Importance of Being Programmable," *FPGA and Structured ASIC Journal*, Sep. 27, 2005.

Nelson, B.E., "Reconfigurable Computing: An Introduction and Overview," Sep. 23, 1998, pp. 1-43.

Niedzielski, D., "An Overview of Reconfigurable Computing."

Ochotta, E.S., et al., "A Novel Predictable Segmented FPGA Routing Architecture," *FPGA 98*, Feb. 1998, pp. 3-11, ACM, Monterey, CA.

Ohkura J., et al., "Dataflow in the Adaptive Computing Machine (ACM)," *A Technology Application Whitepaper*, Apr. 28, 2004 but © 2003, pp. 1-9, QuickSilver Technology, Inc., San Jose, CA.

Parhami, B., "Part IV: Low-Diameter Architectures," *ECE 254B: Advanced Computer Architecture: Parallel Processing, UCSB*, Spring 2005 Month N/A, slides 1-93, Behrooz Parhami, Santa Barbara, CA.

Patel, C., et al., "An Architectural Exploration of Via Patterned Gate Arrays," *Proceedings of the 2003 International Symposium on Physical Design*, Apr. 6-9, 2003, pp. 184-189, Monterey, CA.

Patel, C., et al., "An Architectural Exploration of Via Patterned Gate Arrays," *Carnegie Mellon University Center for Silicon System Implementation*.

Pedram, M., "IEEE Circuits and Systems Society Distinguished Lecturer Program."

Pedram, M., et al., "A New Design for Double Edge Triggered Flip-flops", Feb. 10-13, 1998.

Perissakis, S., et al., "Embedded DRAM for a Reconfigurable Array," *Proceedings of the 1999 Symposium on VLSI Circuits*, Jun. 1999, slides 1-24.

Perissakis, S., et al., "Embedded DRAM for a Reconfigurable Array," *Proceedings of the 1999 Symposium on VLSI Circuits*, Jun. 1999.

Plunkett, B., "In Search of the SDR Holy Grail," *A Technology Application Whitepaper*, Apr. 28, 2004 but © 2003, pp. 1-7, QuickSilver Technology, Inc., San Jose, CA.

Plunkett, B., et al., "Adapt2400 ACM Architecture Overview," *A Technology Whitepaper*, 2004 Month N/A, pp. 1-9, QuickSilver Technology, Inc.

QuickLogic Corp., "Ultra-Low Power FPGA Combining Performance, Density, and Embedded RAM", *Eclipse II Family Data Sheet*, Nov. 2005, pp. 1-92, QuickLogic Corporation, US.

QuickSilver Technology, Inc., "Adapt2000 ACM System Platform," Apr. 2004, pp. 1-39, QuickSilver Technology, Inc., San Jose, CA.

QuickSilver Technology, Inc., "InSpire SDK Tool Set," *Product Brief*, 2004 Month N/A, QuickSilver Technology, Inc., San Jose, CA.

QuickSilver Technology, Inc., "QS2412 Adaptive Computing Machine," *Product Brief*, 2004 Month N/A, QuickSilver Technology, Inc., San Jose, CA.

Rahman, A., et al., "Wiring Requirement and Three-Dimensional Integration Technology for Field Programmable Gate Arrays," *IEEE Transactions on Very Large Scale Integration (VLSI) Systems*, Feb. 2003, pp. 44-54, vol. 11, No. 1, IEEE.

Rose, J., "Hard vs. Soft: The Central Question of Pre-Fabricated Silicon," *34th International Symposium on Multiple-Valued Logic (ISMVL '04)*, May 2004, pp. 2-5.

Sambhwani, S., et al., "Implementing W-CDMA Transceiver Structure on an Adaptive Computing Platform," *A Technology Application Whitepaper*, Apr. 28, 2004 but © 2003, pp. 1-12, QuickSilver Technology, Inc., San Jose, CA.

Scalera, S.M., et al., "A Mathematical Benefit Analysis of Context Switching Reconfigurable Computing," *Proceedings of the 5th Reconfigurable Architectures Workshop (RAW)*, Mar. 30, 1998, vol. 1388 of *Lecture Notes in Computer Science*, pp. 73-78.

Schaumont, P., et al., "A Quick Safari Through the Reconfiguration Jungle," *38th Design Automation Conference*, Jun. 2001, pp. 172-177, Las Vegas, NV.

Schmit, H., "Extra-Dimensional Island-Style FPGAs," *Field Programmable Logic and Application (FPL 2003)*, Sep. 2003, pp. 406-415.

Schmit, H., "Extra-dimensional Island-Style FPGAs," *Field Programmable Logic and Application (FPL 2003)*, Sep. 2003, slides 1-26.

Schmit, H., "Incremental Reconfiguration for Pipelined Applications," *Proceedings of the 5th IEEE Symposium on FPGA-Based Custom Computing Machines*, Apr. 16-18, 1997.

Schmit, H., et al., "FPGA Switch Block Layout and Evaluation," *FPGA '02*, Feb. 24-26, 2002, ACM, Monterey, CA.

Schmit, H., et al., "PipeRench: A Virtualized Programmable Datapath in 0.18 Micron Technology," *Proceedings of the IEEE 2002 Custom Integrated Circuits Conference*, May 12-15, 2002, pp. 63-66.

Schmit, H., et al., "Queue Machines: Hardware Compilation in Hardware," *Proceedings of the 10th Annual IEEE Symposium on Field-Programmable Custom Computing Machines*, Apr. 22-24, 2002.

Sharma, A., et al., "Accelerating FPGA Routing Using Architecture-Adaptive A* Techniques," *Proceedings of the IEEE Conference on Field-Programmable Technology 2005*, Dec. 11-14, 2005.

Singh, A., et al., "Interconnect Pipelining in a Throughput-Intensive FPGA Architecture," *FPGA 2001*, Feb. 11-13, 2001, pp. 153-160, ACM, Monterey, CA.

Singh, A., et al., "PITIA: An FPGA for Throughput-Intensive Applications," *IEEE Transactions on Very Large Scale Integration (VLSI) Systems*, Jun. 2003, pp. 354-363, vol. 11, No. 3, IEEE.

Slade, A.L., et al., "Reconfigurable Computing Application Frameworks," *11th Annual IEEE Symposium on Field-Programmable Custom Computer Machines*, Apr. 9-11, 2003.

Snider, G., "Performance-Constrained Pipelining of Software Loops onto Reconfigurable Hardware," *FPGA '02*, Feb. 24-26, 2002, pp. 177-186, ACM, Monterey, CA.

Tau, E., et al., "A First Generation DPGA Implementation," *Proceedings of the Third Canadian Workshop on Field-Programmable Devices*, May 1995, pp. 138-143.

Tau, E., et al., "Transit Note #114: A First Generation DPGA Implementation," *M.I.T. Transit Project*, Jan. 1995, pp. 1-8.

Taylor, R., et al., "Enabling Energy Efficiency in Via-Patterned Gate Array Devices", *Proceedings of the 41st annual conference on Design automation*, Jun. 7-11, 2004, San Diego, CA.

Teifel, J., et al., "Highly Pipelined Asynchronous FPGAs," *Proceedings of the 2004 ACM/SIGDA 12th International Symposium on Field Programmable Gate Arrays*, Feb. 22-24, 2004, ACM, Monterey, CA.

Tessier, R., et al., "Balancing Logic Utilization and Area Efficiency in FPGAs," *Proceedings of the Roadmap to Reconfigurable Computing, 10th International Workshop on Field Programmable Logic and Applications*, Aug. 27-30, 2000, pp. 535-544.

Tom, M., et al., "Clustering of Large Designs for Channel-Width Constrained FPGAs," *University of British Columbia, Department of Electrical and Computer Engineering*, Jun. 2005, slides 1-39, Vancouver, British Columbia, Canada.

Tom, M., et al., "Logic Block Clustering of Large Designs for Channel-Width Constrained FPGAs" *DAC 2005*, Jun. 13-17, 2005, pp. 726-731, ACM, Anaheim, CA.

Tong, K.T., et al., "Regular Logic Fabrics for a Via Patterned Gate Array (VPGA)," *Proceedings of the IEEE 2003 Custom Integrated Circuits Conference 2003*, Sep. 21-24, 2003.

Tsu, W., et al., "HSRA: High-Speed, Hierarchical Synchronous Reconfigurable Array," *Proceedings of the International Symposium on Field Programmable Gate Arrays*, Feb. 1999, pp. 69-78.

Wawrzynek, J., "EECS150-Digital Design: Lecture 5—Field Programmable Gate Arrays (FPGAs)," Feb. 4, 2002, slides 1-20.

Weaver, N., et al., "The SFRA: A Corner-Turn FPGA Architecture," *FPGA '04*, Feb. 22-24, 2004, ACM, Monterey, CA.

Wilton, S.J.E., "Memory-to-Memory Connection Structures in FPGAs with Embedded Memory Arrays," *FPGA 97*, Feb. 1997, pp. 10-16, ACM, Monterey, CA.

Xilinx, Inc., "Virtex-4 Family Overview," *Advance Product Specification*, Sep. 10, 2004, pp. 21-30, v1.1, Xilinx, Inc.

Zhang, M., et al., "Design of Soft Error Tolerant Logic Circuits," pp. 1-4.

Zhang, M., et al., "Design of Soft Error Tolerant Logic Circuits," *Ming Zhang, University of Illinois at Urbana-Champaign, 2005*, 2005, pp. 1-23.

Zilic, Z. et al., "Using BDDs to Design ULMs for FPGAs," *Proceedings of the 1996 ACM Fourth International Symposium on Field-Programmable Gate Arrays (FPGA '96)*, Feb. 11-13, 1996, pp. 1-10, Monterey, CA.

Zuchowski, P.S., "A Hybrid ASIC and FPGA Architecture," *Proceedings of the 2002 IEEE/ACM International Conference on Computer-Aided Design*, Nov. 10-14, 2002, pp. 187-194, San Jose, CA.

* cited by examiner

CONFIGURABLE IC WITH ERROR DETECTION AND CORRECTION CIRCUITRY

CROSS REFERENCE TO RELATED APPLICATION

This Application is related to the following applications with the same filing date: U.S. patent application Ser. No. 11/390,973, filed Mar. 27, 2006 now U.S. Pat. No. 7,529,992.

FIELD OF THE INVENTION

The present invention is directed towards a configurable IC with error detection circuitry.

BACKGROUND OF THE INVENTION

The use of configurable integrated circuits ("IC's") has dramatically increased in recent years. One example of a configurable IC is a field programmable gate array ("FPGA"). An FPGA is a field programmable IC that often has logic circuits, interconnect circuits, and input/output (I/O) circuits. The logic circuits (also called logic blocks) are typically arranged as an internal array of circuits. The logic functions of these circuits are typically configured by the contents of an internal Static Random Access Memory (SRAM) which is loaded with data from an external source prior to operation.

FIG. 1 illustrates an example of a configurable logic circuit 100. This logic circuit can be configured to perform a number of different functions. As shown in FIG. 1, the logic circuit 100 receives a set of input data 105 and a set of configuration data 110. The configuration data set is stored in a set of SRAM cells 115. From the set of functions that the logic circuit 100 can perform, the configuration data set specifies a particular function that this circuit has to perform on the input data set. Once the logic circuit performs its function on the input data set, it provides the output of this function on a set of output lines 120. The logic circuit 100 is said to be configurable, as the configuration data set "configures" the logic circuit to perform a particular function, and this configuration data set can be modified by writing new data in the SRAM cells. Look-up tables are examples of configurable logic circuits.

FIG. 2 illustrates an example of a configurable interconnect circuit 200. This interconnect circuit 200 connects a set of input data 205 to a set of output data 210. This circuit receives configuration data bits 215 that are stored in a set of SRAM cells 220. The configuration bits specify how the interconnect circuit should connect the input data set to the output data set. The interconnect circuit 200 is said to be configurable, as the configuration data set "configures" the interconnect circuit to use a particular connection scheme that connects the input data set to the output data set in a desired manner. Moreover, this configuration data set can be modified by writing new data in the SRAM cells. Multiplexers are one example of interconnect circuits.

During operation, the contents of SRAM 220 are susceptible to random bit errors (soft errors) due to high-energy atomic particles (such as alpha particles or neutrons) traveling through the chip releasing an avalanche of electrons. The electrons find their way either to the positive supply or to an SRAM storage cell representing one bit of memory. If the total electrical charge reaching the storage cell is larger than the critical charge to upset logic, a soft error takes place. As semiconductor geometries and voltage levels are reduced in order to provide more functionality per chip, the critical charge level is reduced, making soft errors more likely. Undetected, such errors can seriously effect the logical operation of the FPGA and thus affect the system in which it is used, often in unpredictable ways.

One prior art solution to this problem involves a process called scrubbing, which periodically reads back the contents of the configuration memory to an external system, and compares the read-back data to the original data. If a discrepancy is detected, the subsystem using the FPGA can be stopped, the FPGA configuration memory downloaded again and then operation continued. One problem with this approach is that it takes time away from the external process which could have been used to execute other tasks. A second problem with this approach is that it results in a high probability that a system fault will occur between the times the external system checks the configuration memory.

Another prior art solution to the problem involves the application of triple modular redundancy (TMR). With TMR, the IC requires three copies of the user circuit, all of which are initially loaded with the same data by a configuration network. During operation, the outputs of the three circuits are compared to each other. If one of these differs from the other two, then only data from one of the two matching circuits is used. The primary problem with this method is that it requires more than three times as much IC real estate to implement.

Accordingly, there is a need for a configurable IC that has the ability to check and correct its configuration memory continuously, during normal operation of the system in which it is embedded. Moreover, there is also a need for a configurable IC that has the ability to check and correct its configuration memory independently of the external system.

SUMMARY OF THE INVENTION

Some embodiments of the invention provide a configurable IC that performs error detection and correction of its configuration data. This configurable IC includes a configuration memory for storing configuration data. This IC further includes (1) error detection circuitry for detecting an error, and (2) a circuit that outputs from the IC an uncorrectable error signal indicating the detection of an error. In some embodiments, the configurable IC has a circuit that causes the IC to reset when the error circuitry detects an uncorrectable error. In some embodiments, a circuit outside of the IC causes the IC to reset when the error circuitry detects an uncorrectable error.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments of the invention provide a configurable IC that performs error detection and correction of its configuration data. This configurable IC includes a configuration memory for storing configuration data and error correction data. This IC further includes error correction circuitry for (1) receiving the configuration data, (2) correcting a particular error in the received configuration data when the particular error exists in the configuration data, and (3) outputting the configuration data without the particular error. The configurable IC has a configurable circuit (e.g., a configurable logic circuit or a configurable interconnect circuit) that receives the potentially error-corrected configuration data from the error correction circuitry. In some embodiments, the configurable IC includes circuitry to write the corrected configuration data and error data back into the configuration memory.

I. Memory Error Detection and Correction Structures

Figure 1:
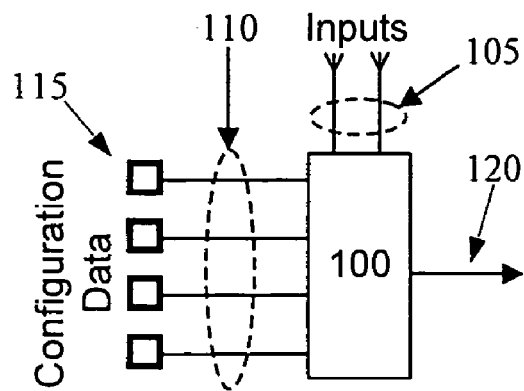
FIG. 1 illustrates an example of a configurable logic circuit.
Figure 2:
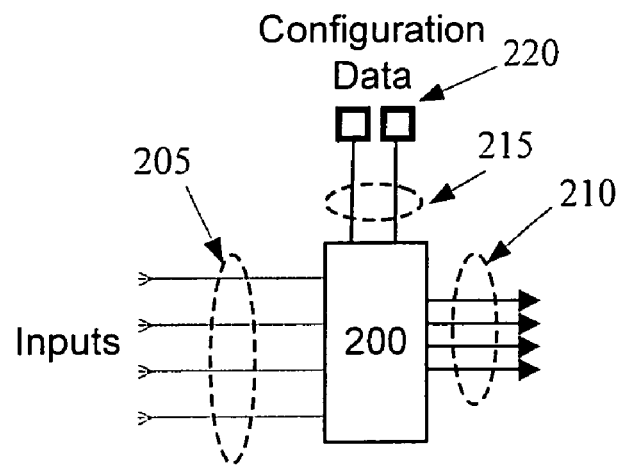
FIG. 2 illustrates an example of a configurable interconnect circuit.
Figure 3:
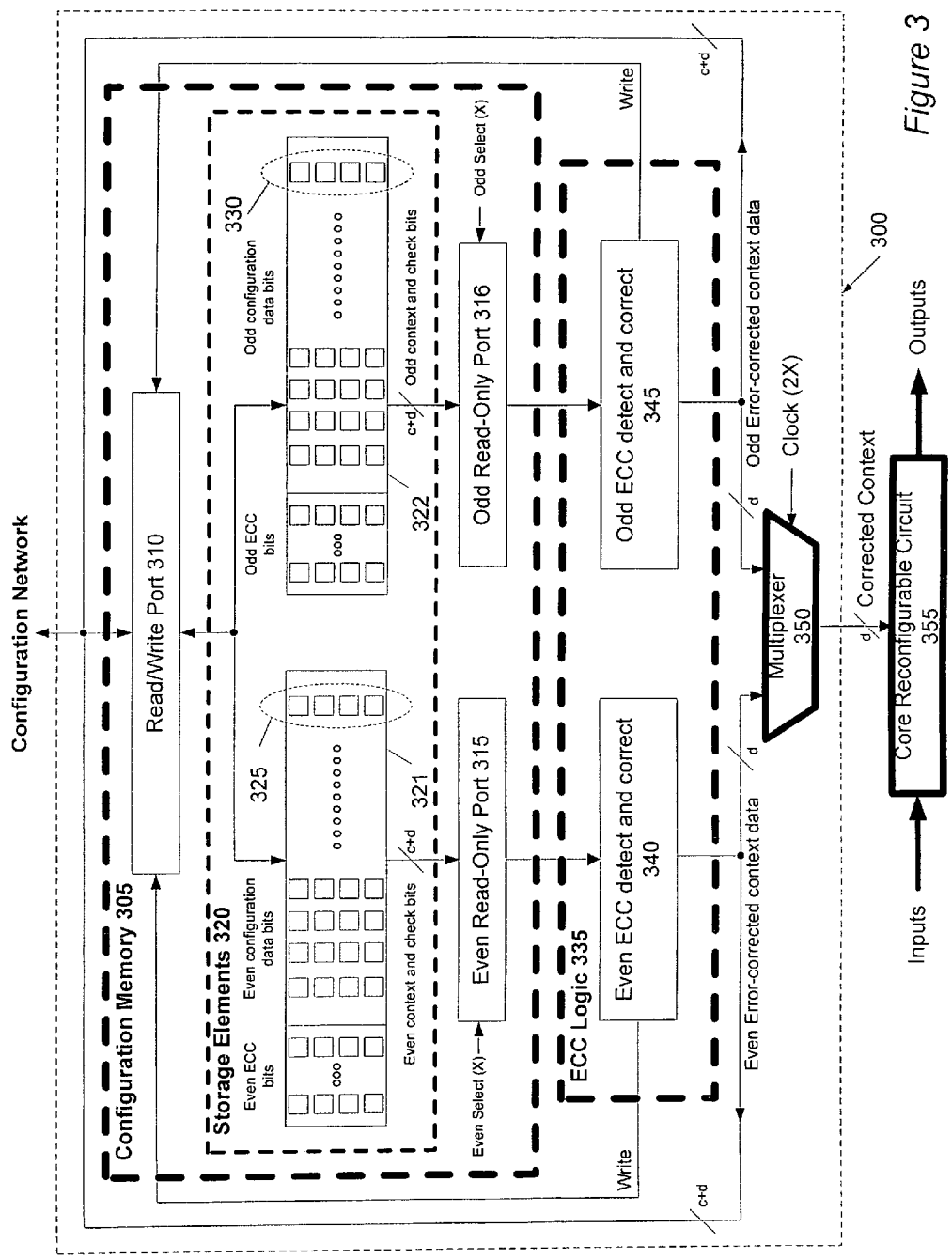
FIG. 3 illustrates an example of a circuit for ECC error detection and correction of a configuration memory where the ECC logic precedes a multiplexer and corrected data writeback is directly to configuration memory.

FIG. 3 illustrates a portion of a configurable IC of some embodiments of the invention. This configurable IC has an error correcting circuitry 300 that stores, outputs, and processes configuration and error correction bits for a particular core reconfigurable circuit 355. The circuitry 300 provides a configuration data word to the core reconfigurable circuit 355 at a particular rate. In some embodiments, this particular rate is a sub-cycle rate that is faster than a design cycle rate, where the design cycle rate is the rate of a design that the configurable IC is implementing. Examples of configurable IC's that implement IC designs by operating reconfigurable circuits at rates faster than the design rate are provided in U.S. patent application Ser. No. 11/081,859 "Configurable IC with Interconnect Circuits that also Perform Storage Operations".

As shown FIG. 3, the circuitry 300 includes a configuration memory 305, ECC logic 335 and a multiplexer 350. The configuration memory 305 includes a read/write port 310, two banks of storage elements 321 and 322, and two read only ports 315 and 316. This port 310 stores the received configuration and error-correction data in one of two banks of storage elements. In some embodiments, the storage elements are SRAM cells. The read/write port receives configuration and error correction data from the configuration network. The configuration network is the source of configuration information and a shared interface to an application electronic system, which is further described below.

Each word of configuration data accessed from one of the two banks of storage elements is termed a context as it defines the operation (i.e., the logic or interconnect operation) that the core reconfigurable circuit 355 (i.e., logic or interconnect circuit) performs for a particular sub-cycle out of the set of operations that the circuit 355 can perform. Each configuration data word is read out with an associated error-correction word (i.e., with an associated error-correction code, or ECC) that contains the data necessary for detection and correction of an error in its associated configuration data word. Each configuration data word and its associated ECC form a configuration/ECC data word. In some embodiments, each configuration data word is stored in the same storage-element bank as its associated ECC.

The configuration memory 305 uses two banks 321 and 322 of storage elements because the circuitry 300 utilizes a two-tiered multiplexer structure to provide configuration data words at an effective data rate of 4× to the core reconfigurable circuit 355. This two-tiered multiplexer structure (1) uses a set of two or more out-of-phase signals ST operating at a rate of X to read the two banks 321 and 322 in an interleaved manner, and (2) uses a clock signal CLK that operates at a rate of 2× to operate the multiplexer 350.

More specifically, FIG. 3 conceptually illustrates the circuitry for reading out the two storage-element banks 321 and 322 as the read-only ports 315 and 316. These read-only ports (i.e., the circuitry for reading out the two storage-element banks 321 and 322) receive the set of two or more out-of-phase signals ST, as shown in FIG. 3. In response to these two clock signals, the read-only ports 315 and 316 output configuration/ECC words to the ECC logic 335 at a data rate of 2×. The operation of the read-only ports 315 and 316 will be further described below by reference to FIG. 9 and FIG. 10.

As shown in FIG. 3, the ECC logic 335 has two components: (1) an even correction circuit block 340 for processing configuration/ECC words that are read out of the even storage-element bank 321, and (2) an odd correction circuit block 345 for processing configuration/ECC words that are read out of the odd storage-element bank 322. As further described below, each of these error correction blocks (1) detects particular errors (e.g., one bit errors) in any configuration/ECC word that it receives, (2) if there is an error, corrects it, and (3) provides the potentially corrected configuration data word of the configuration/ECC word to the multiplexer 350 at a rate of 2×. If an error-correction block detects and corrects an error in a configuration/ECC word, the error-correction block writes back the corrected configuration/ECC word back to the appropriate storage-element bank. This write-back is further described below by reference to FIGS. 5-7.

As mentioned above, the multiplexer 350 receives configuration data words at a 2× rate from the ECC logic 335. The select line of the multiplexer is controlled by a clock signal that operates at a rate of 2×. This allows the multiplexer to output error-corrected configuration data words at a rate 4× to the core reconfigurable circuit 355.

Figure 4:
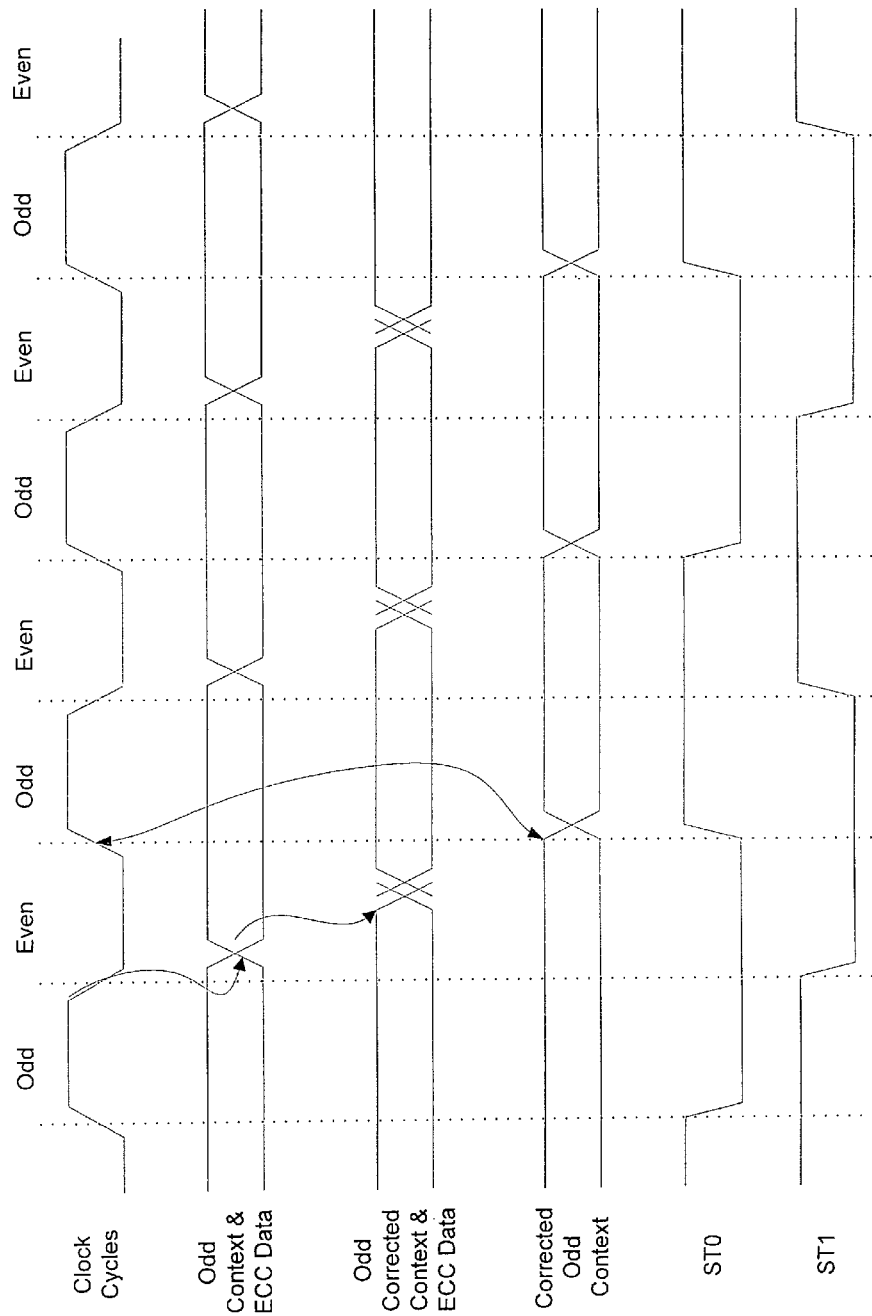
FIG. 4 illustrates the timing between the Odd/Even clock signals, Odd context signals, and state signals ST0, and ST1.

FIG. 4 provides the timing diagram for the circuitry 300 in some embodiments. In this example, the circuitry stores four configuration data words that are provided to the reconfigurable circuit in four looping cycles. Each configuration data word can have any arbitrary number of bits.

To enable this "four-loopered" design, the read-only ports 315 and 316 receive two 90° out-of-phase clock signals ST0 and ST1 that operate at a rate X. In response to these two clock signals, the read-only port 315 outputs configuration/ECC words to the even ECC logic 340 at a data rate of 2× during the even phases. Similarly, the read-only port 316 outputs configuration/ECC words to the odd ECC logic 345 at a data rate of 2× during the odd clock phases.

The multiplexer 350 receives on its select line a clock signal CLK that operates at a rate 2×. The relationship between the clock signals ST0, ST1, and CLK are illustrated in FIG. 4. As shown in this figure, an odd configuration/ECC data word is read on the falling edge of the clock CLK. Similarly, an even configuration/ECC data word is read on the rising edge of the clock CLK. The ECC blocks correct the read out configuration/ECC data words in half the cycle of the clock CLK. Accordingly, to provide error corrected configuration data to the core reconfigurable circuit 355, the read-only port reads out each storage element bank at a data rate of 2×, in an interleaved manner. Hence it can provide corrected configuration data words to the multiplexer at the rate of 2×. The multiplexer 350 then provides the reconfigurable circuit 355 the corrected configuration data at a rate 4×, as its select is controlled by the clock signal CLK.

II. Write Back

Figure 5:
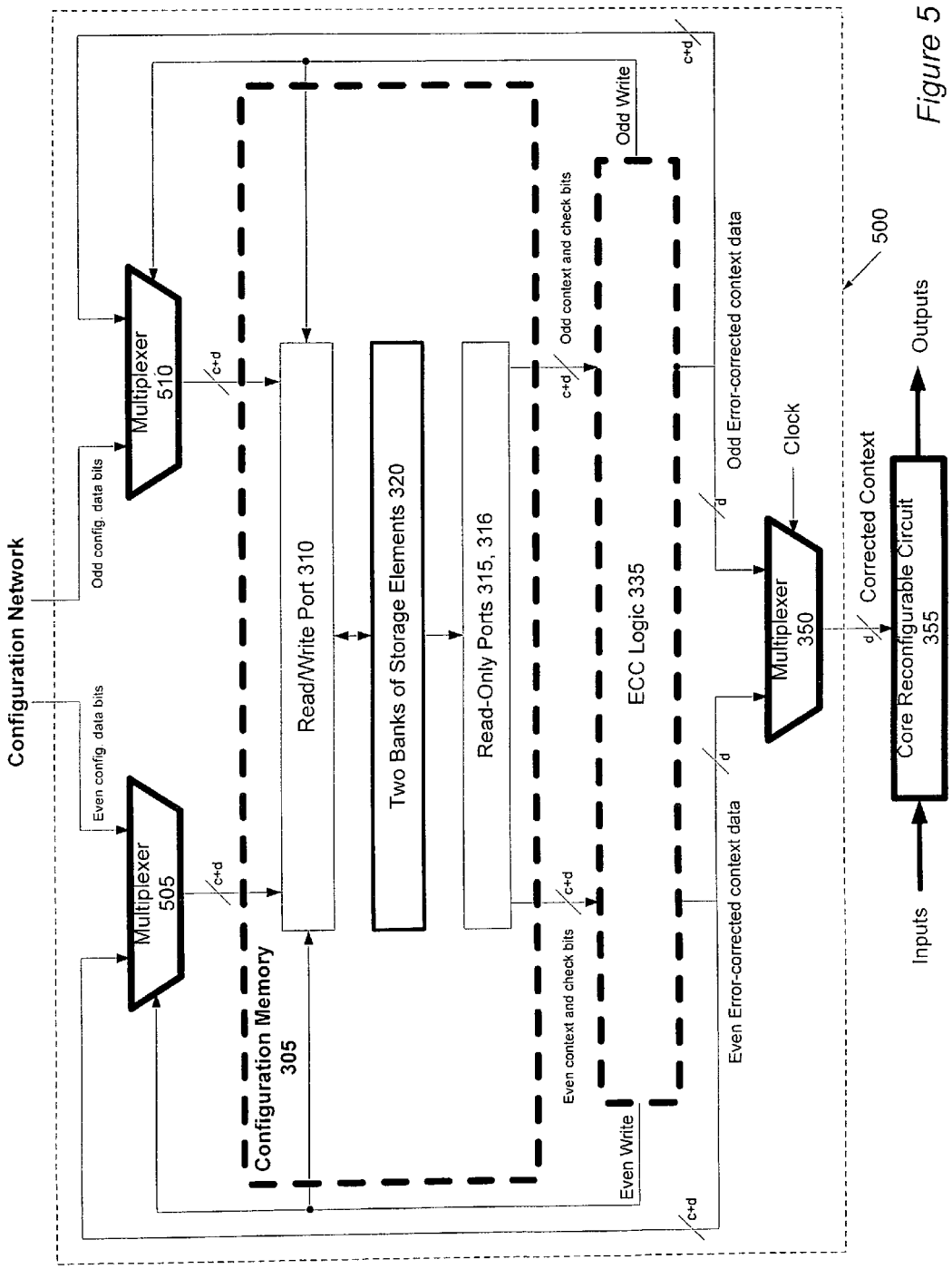
FIG. 5 illustrates the interface between ECC logic output of error-corrected context data and writeback input to configuration memory.
Figure 6:
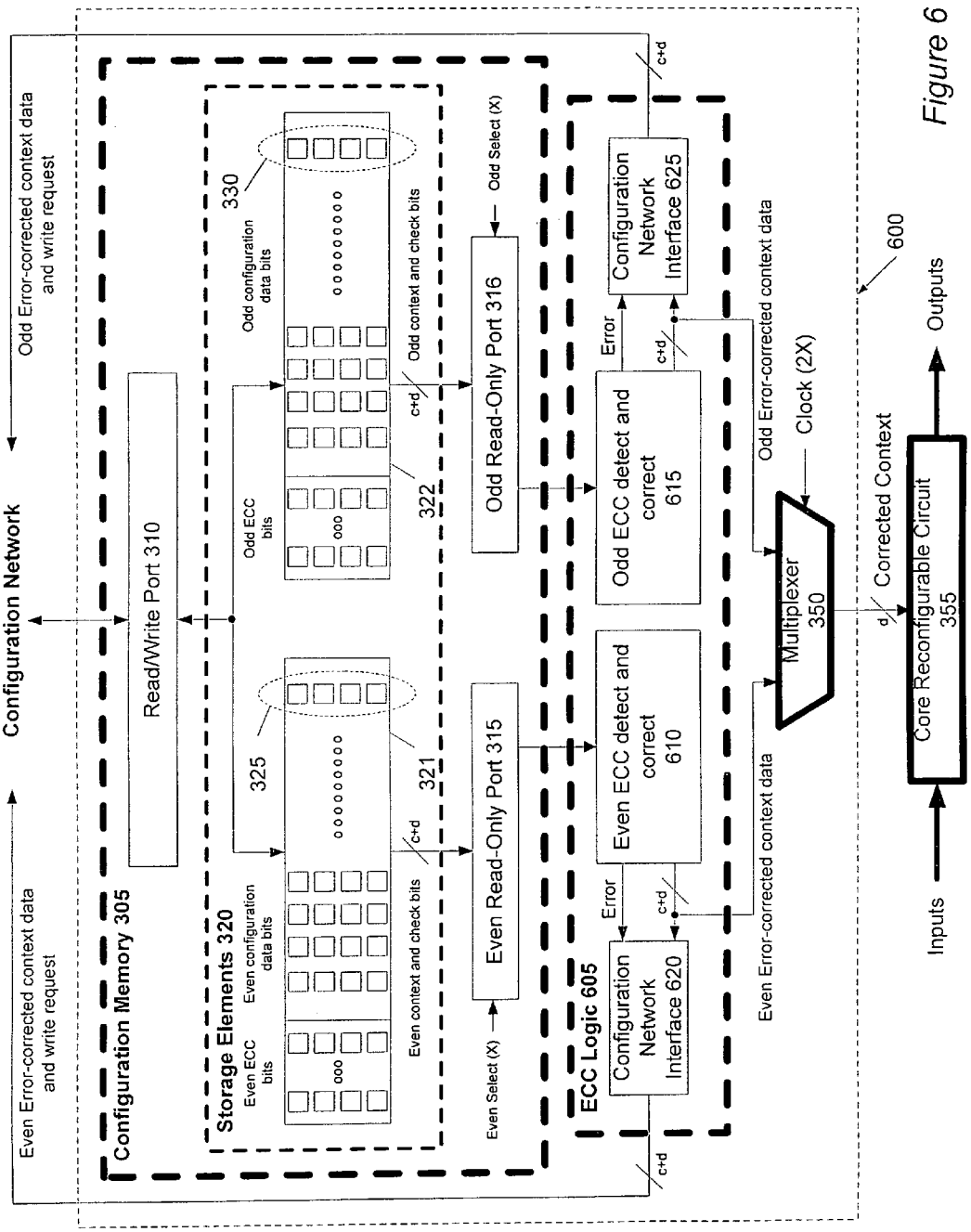
FIG. 6 illustrates an example of a circuit for ECC error detection and correction of a configuration memory where the ECC logic precedes a multiplexer and corrected data writeback is through a configuration network.

As mentioned above, the ECC blocks 340 and 345 write back any configuration/ECC word that they correct to the storage-element banks 321 and 322. FIGS. 5 and 6 illustrate two different approaches that some embodiments use to achieve this write back.

FIG. 5 illustrates the circuitry needed to route the corrected configuration/ECC data from the ECC logic directly back to the configuration memory. As shown in this figure, this circuitry includes two multiplexers 505 and 510. The even multiplexer 505 selects between the configuration network and the even ECC block of the ECC logic 335, based on the write signal from the ECC logic 335. Similarly, the odd multiplexer 510 selects between the configuration network and the even ECC block of the ECC logic 335, based on the write signal from the ECC logic 335.

The function of these multiplexers is to select whether the configuration network or the ECC logic 335 provides write data to the configuration memory 305. If the ECC logic detects and corrects an error in the context data it outputs this write signal. The write signal also causes the selected data from the multiplexer to be written into the storage elements 320 via the read/write port 310. Asserting the write signal causes the corrected context data to be written into the configuration memory 305 on a priority basis over requests to write data from the configuration network.

Instead of directly writing back an error corrected, configuration/ECC data word, some embodiments write back such a data word through the configuration network. FIG. 6 illustrates one such approach. To write back the corrected configuration/ECC data words through the configuration network, the circuitry 600 of FIG. 6 includes a configuration network interface 620 for each of the ECC blocks 610 and 615 in the ECC logic 605.

When the ECC logic detects an error in the context data, it signals the configuration network interface with an error signal. This interface then sends the corrected configuration/ECC data to the configuration network and requests it to write the data back to the configuration memory through the read/write port 310. The odd and even ECC logic also outputs the corrected data to the multiplexer 350 which feeds the core reconfigurable circuit 355.

III. Alternate Position for the ECC Block

Figure 7:
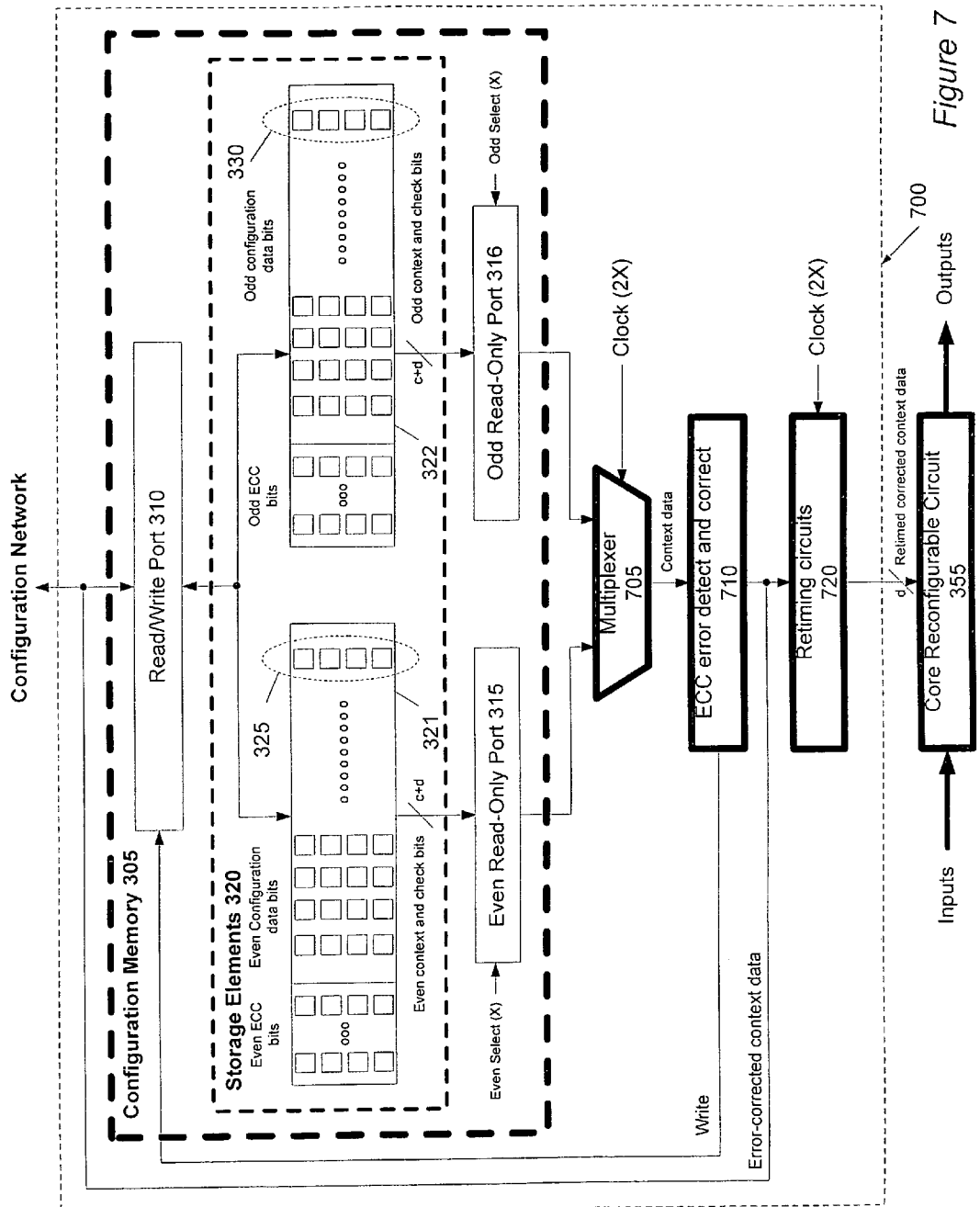
FIG. 7 illustrates an example of a circuit for ECC error detection and correction of a configuration memory where the ECC logic is located after a multiplexer and corrected data writeback is directly to configuration memory.

In some embodiments, design tradeoffs in circuit speed, die area and routing may make it advantageous to structure the IC with a single ECC logic circuit rather than the even and odd sections shown in FIG. 3. FIG. 7 illustrates a portion of such a configurable IC. Specifically, this figure illustrates an error correcting circuitry 700 that stores, outputs, and processes configuration and error correction bits for a particular reconfigurable circuit 355.

Like the circuitry 300 of FIG. 3, the circuitry 700 of FIG. 7 provides a configuration data word to the reconfigurable circuit 355 at a particular rate. Also, like the circuitry 300, the circuitry 700 includes a configuration memory 305 with two storage-element banks 321 and 322. It also has a multiplexer 705 that is similar to the multiplexer 350. However, the multiplexer 750 is before an ECC logic 710, instead of after the ECC logic as in circuitry 300. The circuitry 700 also includes a retiming circuit 720.

As in the circuitry 300, the configuration memory 305 of the circuitry 700 outputs even and odd configuration/ECC data words in an interleaved manner at a rate 2×. The multiplexer 705 receives on its select line a clock signal CLK that operates at a rate 2×. Accordingly, the multiplexer 705 can output the received configuration/ECC data words at a rate 4× to the single ECC logic block 710.

The ECC logic block 710 then performs error detection/correction operation on the configuration/ECC data word that it receives. Specifically, for each configuration/ECC data word that it receives, the ECC logic block (1) detects particular errors (e.g., one bit errors) in the configuration/ECC word, (2) if there is an error, corrects it, and (3) provides the potentially corrected configuration data word of the configuration/ECC word to the retiming circuit at a rate of 4×. If the error logic block 710 detects and corrects an error in a configuration/ECC word, this block writes back the corrected configuration/ECC word back to the appropriate storage-element bank. To perform the write back, the ECC logic block 710 can use the approaches described above by reference to FIGS. 5 and 6.

The retiming circuit 720 receives the potentially error-corrected configuration data words from the ECC logic block 710. In some embodiments, the retiming circuit is implemented as a set of double edge-triggered flip-flops which can hold or pass-thru the data from the ECC logic to the reconfigurable circuit. Alternately, the retiming circuit could be implemented as a set of edge-triggered flip-flops operating with a 4× clock. The purpose of this retiming register is to allow for context data-dependent variations in the time it takes for data to flow thru the ECC logic and settle within one sub-cycle. Register 720 latches these bits and passes them on to the core reconfigurable circuit 355 at the start of the next sub-cycle. Without register 720, the reconfigurable logic might not receive the configuration data word that is for a particular cycle at the start of that cycle.

Figure 8:
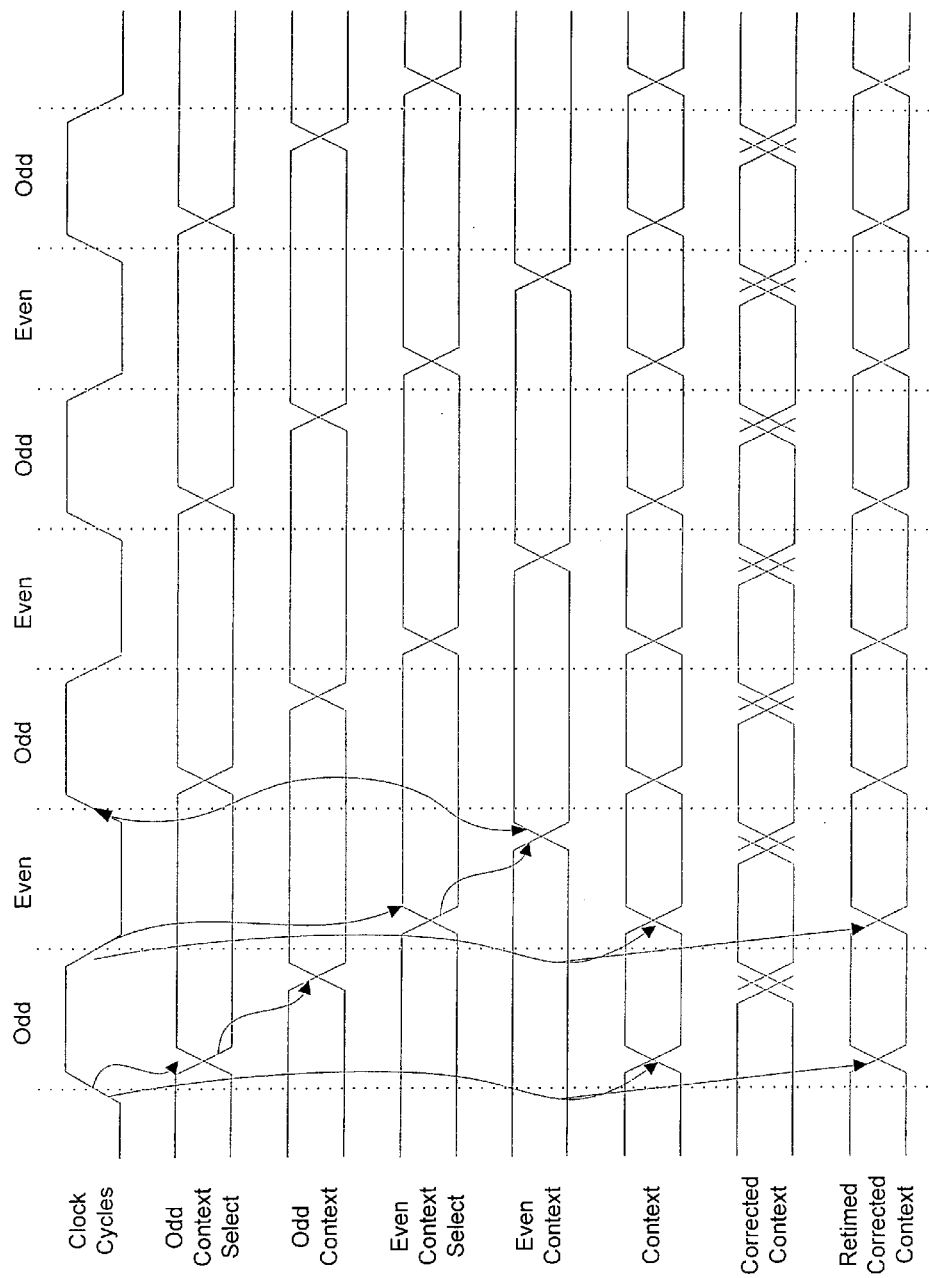
FIG. 8 illustrates the timing between an Odd/Even clock, odd and even context signals, and corrected and retimed context signals.

The timing relationships governing the operation of the circuit shown in FIG. 7 is illustrated in FIG. 8. In particular, it shows the relationship of the odd and even clock signals to the context data as it enters the ECC logic, is corrected and finally retimed and sent to the reconfigurable logic.

IV. Uncorrectable Error Detection and Signaling

In some embodiments described above, the error correction logic can detect and correct a single erroneous bit of a configuration/ECC word. If more than one bit of a configuration/ECC word were in error, then the ECC logic of these embodiments will not be able to correct either or both errors. This situation would then result in use of incorrect configuration data by the reconfigurable circuit 355.

Accordingly, some embodiments of the invention provide the capability to detect, but not correct, a configuration/ECC word with more than one erroneous bit. Upon detection of this condition, the configurable IC of some embodiments generates a signal that causes the configurable IC or a device external to the IC to reload configuration data in the configuration IC. In some embodiments, the configurable IC resets and restarts its operation after such reloading of its configuration data.

Figure 9:
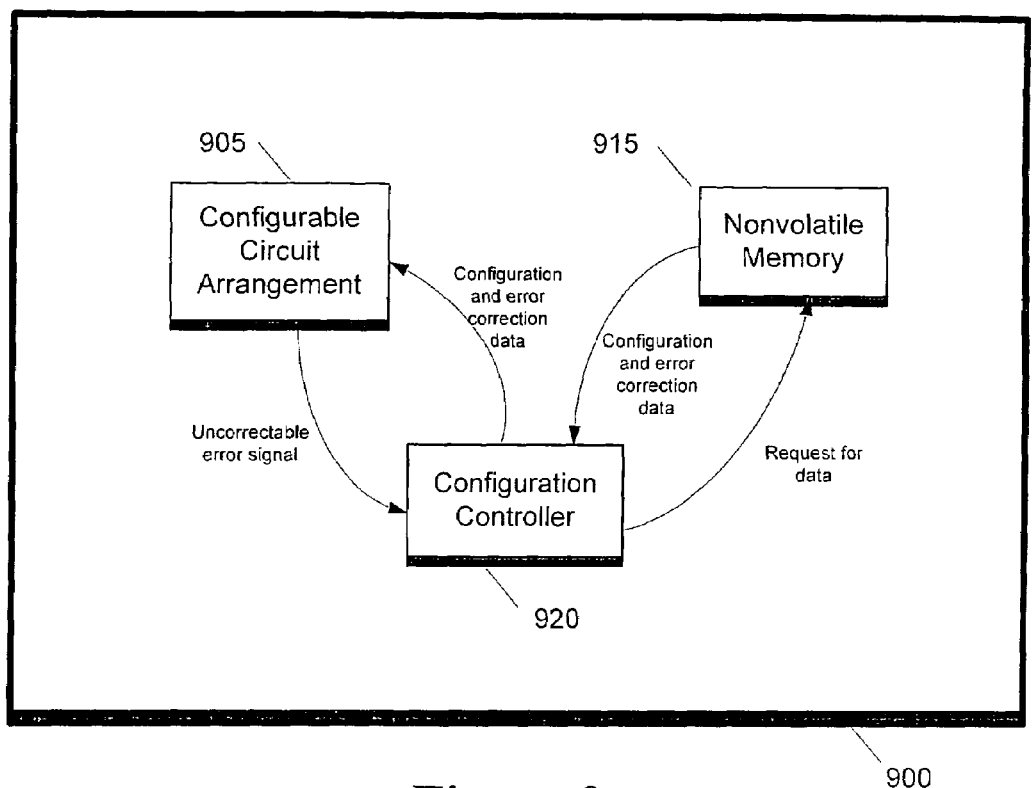
FIG. 9 illustrates a group of components which can reload configuration memory upon detection of an uncorrectable error.

FIG. 9 illustrates a group of components of some embodiments which accomplishes this function. Specifically, this figure illustrates a group of components 900 that can detect uncorrectable errors in configuration memory data and initiate configuration memory reloading.

The group 900 includes a configurable circuit arrangement (e.g., a circuit array) 905, a nonvolatile memory 915, and a configuration controller 920. The configurable circuit arrangement 905 contains configuration memory and associated error detection circuitry. The nonvolatile memory 915 may be loaded with configuration data. When the error detection circuit detects an uncorrectable error, it sends an uncorrectable error signal to the configuration controller 920. In response, the controller 920 retrieves configuration and ECC data from the nonvolatile memory 915 and reloads the configuration and ECC data into the configurable circuit arrangement 905. The controller reloads the data through the configuration network of the configurable circuit arrangement 905 of some embodiments. U.S. patent application Ser. No. 11/375,363, entitled "Configuration Network for a Configurable IC," and filed on Mar. 13, 2006. The reloading of the configuration and error correction data eliminates the error in this data.

In some embodiments, the nonvolatile memory 915 is Flash memory. In other embodiments, this memory may be Electrically Programmable Read Only Memory (EPROM) or ROM programmed during manufacturing of the memory or after manufacturing of the group of components 900. In some embodiments, the group of components 900 could be fabricated by dividing the functions of 905, 915 and 920 among several ICs (i.e., several chips) that are placed on one or more printed wiring boards. In other embodiments, all three component functions, 905, 915 and 920 could be implemented on a single IC die (on a single IC chip). One of ordinary skill in the art would appreciate that any other system configuration may also be used in conjunction with the invention, and these system configurations might use different nonvolatile memory technologies and have fewer or additional components.

Figure 10:
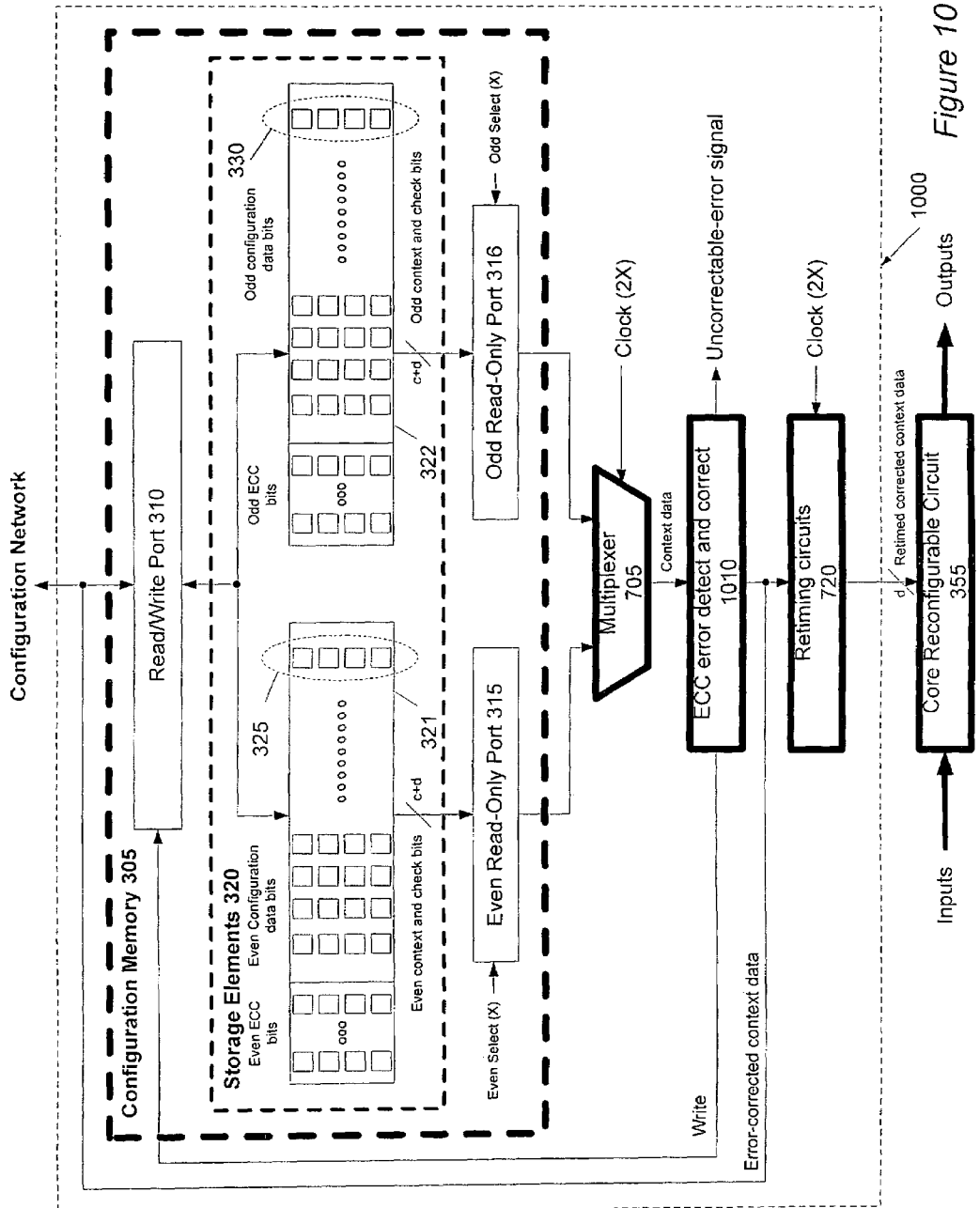
FIG. 10 illustrates a portion of a configurable logic circuit that includes ECC detection of uncorrectable context data errors.

FIG. 10 illustrates a portion of a configurable IC which can detect and signal uncorrectable errors in its configuration data. Specifically, this figure illustrates an error correcting circuitry 1000 that stores, outputs and processes configuration and error correction bits for a particular reconfigurable circuit 355. The circuitry 1000 for FIG. 10 is similar to the circuitry of 700 of FIG. 7, except that the ECC logic circuit 1010 in the circuit 1000 not only can detect and correct n-bit errors in the configuration data words, but also it can detect m-bit errors in the configuration data words, where m>n. In some embodiments, above and below, n equals 1 and m equals 2. However, in other embodiments, n may be greater then 1 and m greater then 2. One of ordinary skill in the art will recognize that other embodiments may be realized of the configurable IC that could detect and correct errors in configuration/ECC words of any lengths m and n where m>n.

Figure 11:
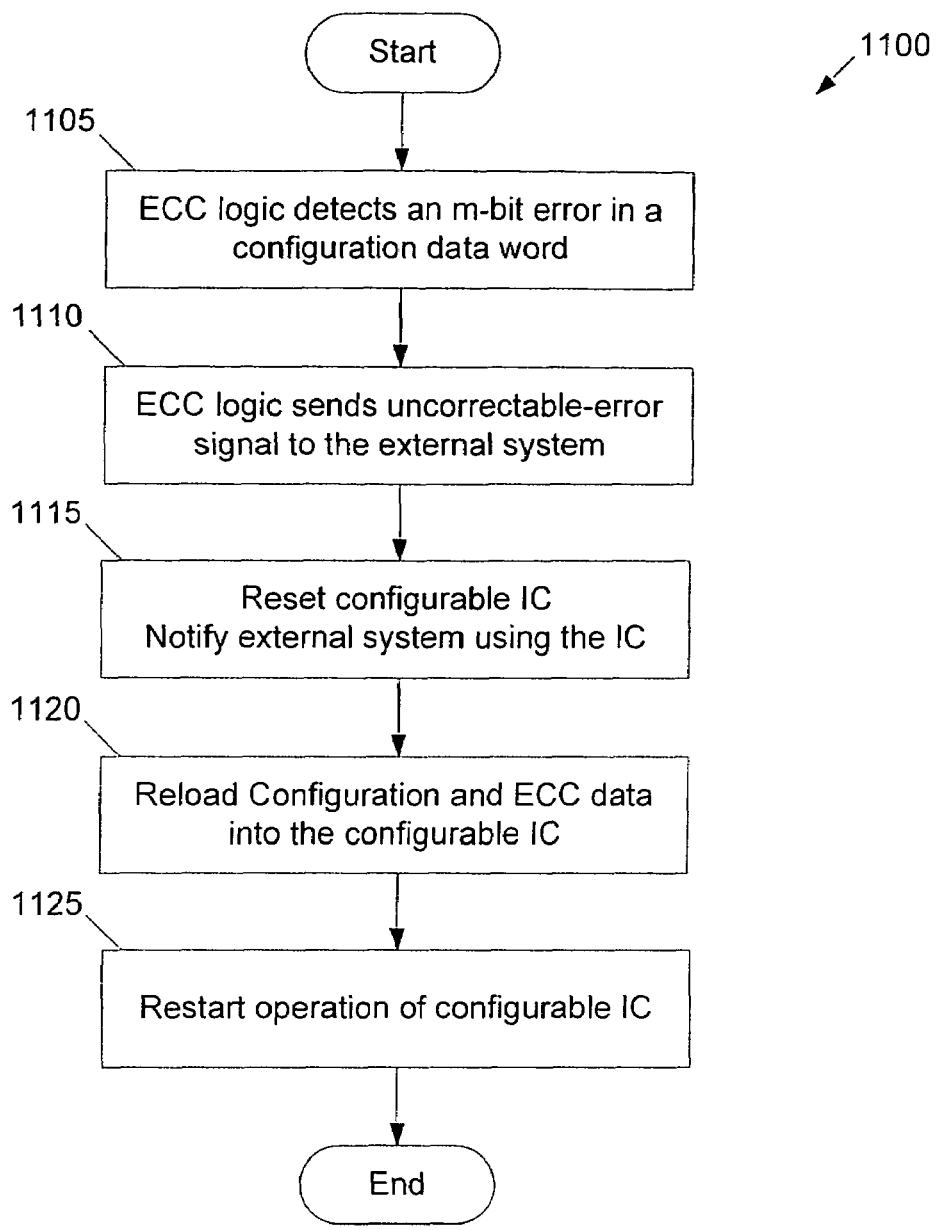
FIG. 11 illustrates a process to signal an external system when the ECC logic detects an uncorrectable context data error.

When the ECC circuit 1000 in FIG. 10 detects an m-bit error in a configuration data word, it outputs an uncorrectable-error signal to signify that it has detected an uncorrectable error. FIG. 11 illustrates one approach that some embodiments take to address such an uncorrectable-error signal. As shown in this figure, the process 1100 of FIG. 11 starts (at 1105) when an ECC logic circuit 1010 of the error-correcting circuitry 1000 of the configurable IC detects a multi-bit error in a configuration data word. Section V describes how some embodiments detect an m-bit error in a configuration data word.

Next, at 1110, the ECC logic circuit that detected the m-bit error in the configuration data word, generates an uncorrectable-error signal. The configurable IC is then reset (at 1115). In some embodiments, the resetting of the configurable IC entails setting the value of several state elements (e.g., latch, register, storage element, memory, etc.) within the IC to a pre-specified value. In some embodiments, circuitry inside of the configurable IC receives the uncorrectable-error signal and in response directs the configurable IC to be reset. In other embodiments, circuitry outside of the configurable IC receives this error signal and in response directs the IC to be reset. Also, when the configurable IC is reset, the system that contains the configurable IC is notified. Such a system can be fault-tolerant and might not need to be reset. In other words, such a system might contain fault-tolerant mechanisms to deal with the resetting of the configurable IC. Alternatively, the system might not be fault tolerant and therefore might have to reset when the configurable IC resets.

After resetting the configurable IC, configuration and ECC data is reloaded (at 1120) into the configurable IC through a configuration network as described above. In some embodiments, the configuration and ECC data is stored in (and hence loaded from) a non-volatile memory outside of the configurable IC. In other embodiments, the configuration and ECC data is stored within (and hence loaded from) a non-volatile memory of the configurable IC. Once the configuration and ECC data is reloaded in the configurable IC, the configurable IC restarts (at 1125) its operation.

V. Error Correction Coding

The purpose of the ECC logic is to ensure the reliability of the context bits in the face of random occurrences of errors introduced into the configuration SRAM. One embodiment of ECC utilizes the block-based algorithms otherwise known as Hamming codes. The simplest such code is the Single-bit Error Correction (SEC) ECC algorithm. That is, a system utilizing the SEC ECC algorithm can detect and correct a data word as long as it contains no more than one erroneous bit. The basic idea of SEC ECC is to map a given data vector into a longer codeword. All valid SEC ECC codewords differ from each other by at least 3 bits in the bit pattern. This difference is known as a Hamming distance of 3. The distance of 3 bits ensures that any given valid SEC ECC codeword can sustain a one bit error, and can unambiguously recover the original valid SEC ECC codeword. The advantage of SEC ECC is that it is relatively inexpensive to implement. SEC ECC requires the use of $(\log_2 d)+1$ check bits (c) for d data bits. The external system initially computes the check bits and combines them with the data bits to form the codeword. These codewords are loaded into the configuration memory by the configuration network prior to operating the reconfigurable IC. Subsequently, the ECC circuits illustrated above maintain the integrity of the data by continuously checking and correcting the check and data bits and writing the result back to the configuration memory.

As described above, the process of encoding a bit vector into a space where the bit vectors have a Hamming distance of 3 means that a single bit error and a double bit error are indistinguishable from each other. Therefore, errors longer than one bit cannot be detected. However, if the data vectors encoded into an ECC codeword are in a space where the codewords have a Hamming distance of 4 from each other, then a one-bit error and a two-bit error can be distinguished from each other. This process is termed Single bit Error Correction with Double bit Error Detection (SECDED) ECC. However, in SECDED ECC, two-bit errors cannot be corrected because multiple valid SECDED codewords can result in the same error vector with different two-bit errors. The cost of SECDED ECC over SEC ECC alone is the addition of one more ECC bit in the data vector. ECC circuit 1000 in FIG. 10 of some embodiments illustrates an example of a portion of a configurable IC in which. SECDED is implemented to detect two-bit errors as well as correcting one-bit errors.

In some embodiments, the number of check bits for SEC ECC is c=5 for d=24 data bits. For SECDED ECC, c=6 for 24 data bits. One of ordinary skill in the art will recognize that c and d could be other values so long as c is greater than or equal to (log 2 d) for SEC ECC and (log 2 d)+1 for SECDED ECC. One of ordinary skill in the art will also recognize that other algorithms for error detection and correction could be utilized and may result in the ability to detect and correct more than one bit and/or result in different values of c and d.

VI. Two Tiered Structure for Retrieving Data

As mentioned above, the read-only port 315 of the various circuits mentioned above conceptually illustrates the circuitry for reading out the two storage-element banks 321 and 322 in an interleaved manner. As further discussed above, this read out circuitry is part of a two-tiered multiplexer structure that can provide configuration data words at a rate of 4× to the reconfigurable circuit 355. This two-tiered multiplexer structure uses (1) a set of two or more out-of-phase signals ST that operate at a rate of X to read the two banks 321 and 322 in an interleaved manner, and (2) uses a clock signal CLK that operates at a rate of 2× to operate the multiplexer 350 or 705.

Figure 12:
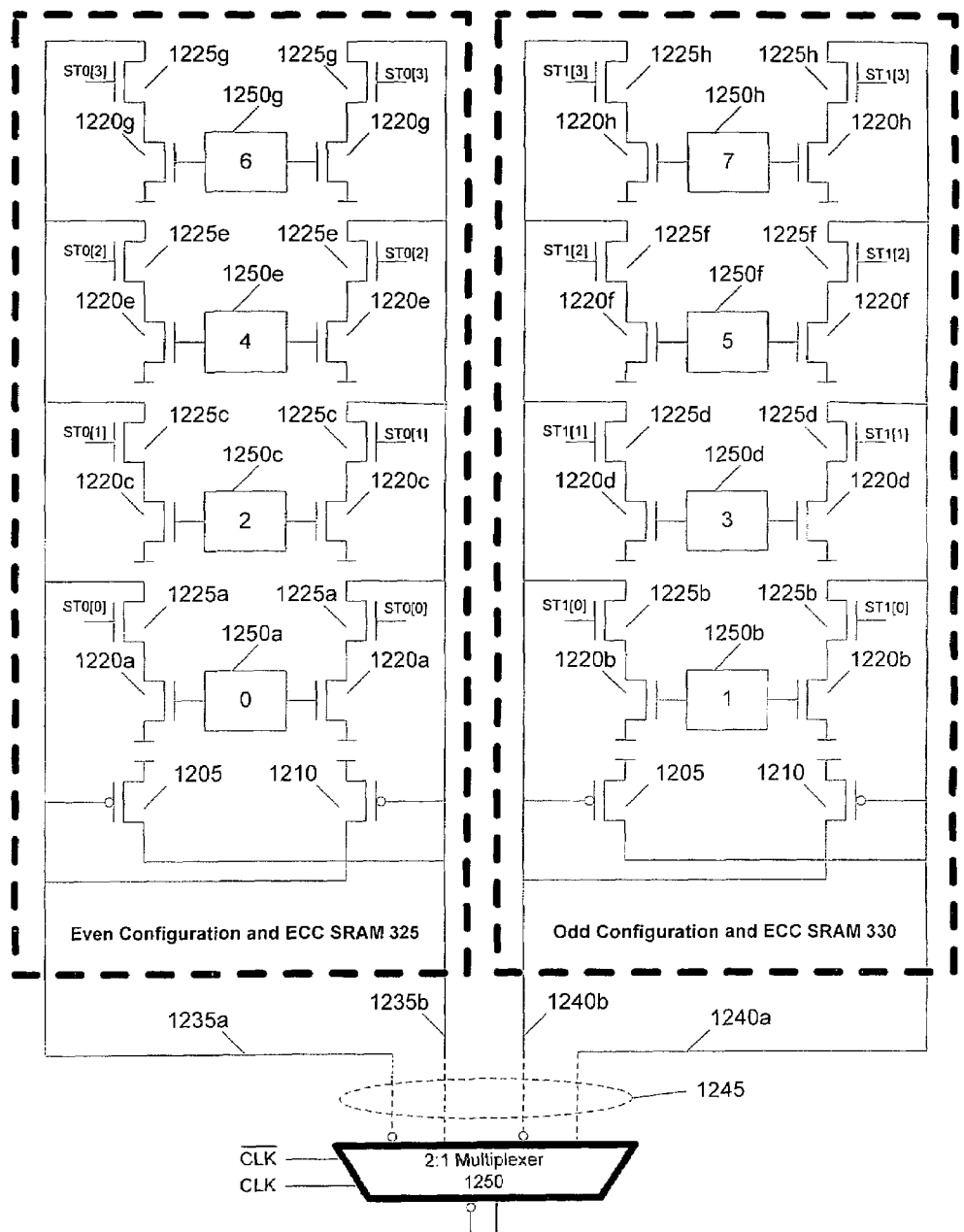
FIG. 12 illustrates a two-tiered interconnect and memory structure.

FIG. 12 illustrates an example of the circuitry for reading out the two storage-element banks 321 and 322. In this example, the circuitry stores eight configuration data words, which are provided to the reconfigurable circuit in eight looping cycles. To enable this "eight-loopered" design, the read-only ports 315 and 316 receive four out-of-phase signals ST0(0)-ST0(3) that operate at a rate X.

FIG. 12 illustrates eight storage cells 1250a-1250h that each store one value for one bit of configuration or error-correction data for each of the eight looping cycles. Four of the cells are in the even storage-element bank, while the other four cells are in the odd storage-element bank.

FIG. 12 also illustrates a multiplexer 1260, which represents either the multiplexer 350 or 705 of FIG. 3 or 7. This multiplexer 1260 represents the second tier of multiplexers in the two-tiered multiplexer structure. This multiplexer receives on its select line a clock signal CLK that operates at a rate 2×.

FIG. 12 further illustrates a first tier of multiplexers that are built into the sensing circuitry of the storage elements 1250. Specifically, this figure illustrates four storage elements 1250a-1250h that are arranged in two columns 325 and 330. Each storage element stores one logical bit of data in a complementary format.

Each of the two complementary outputs of each storage element 1250 connects to a pair of stacked NMOS transistors 1220 and 1225. One transistor 1225 in each stacked pair of NMOS transistors is part of a first tier multiplexer structure. Specifically, in the two-tiered circuit structure 325 and 330 illustrated in FIG. 12, the first tier multiplexer structure is formed by the 16 transistors 1225, which receive the sub-cycle signals ST0[0]-ST0[3] and ST1 [0]-ST1 [3].

Through the sub-cycle signals ST0[0]-ST0[3] and ST1[0]-ST1[3], the multiplexer transistors 1225 selectively connect the NMOS transistors 1220 to the cross-coupled PMOS transistors 1205 and 1210. One pair of PMOS transistors 1205 and 1210 exists in each column and form part of the sensing amplifier for the storage elements in that column.

When the NMOS transistors 1220 associated with one storage element 1250 connect to the PMOS transistors 1205 and 1210, they form a level-converting sense amplifier. This amplifier then translates the signals stored in the storage element to the bit lines 1235 or 1240. The circuits 325 and 330 provide the content of the storage elements through level-converting sense amplifiers, because, in some embodiments, the storage elements are storage cells that use a reduced voltage to store their data in order to conserve power.

Figure 13:
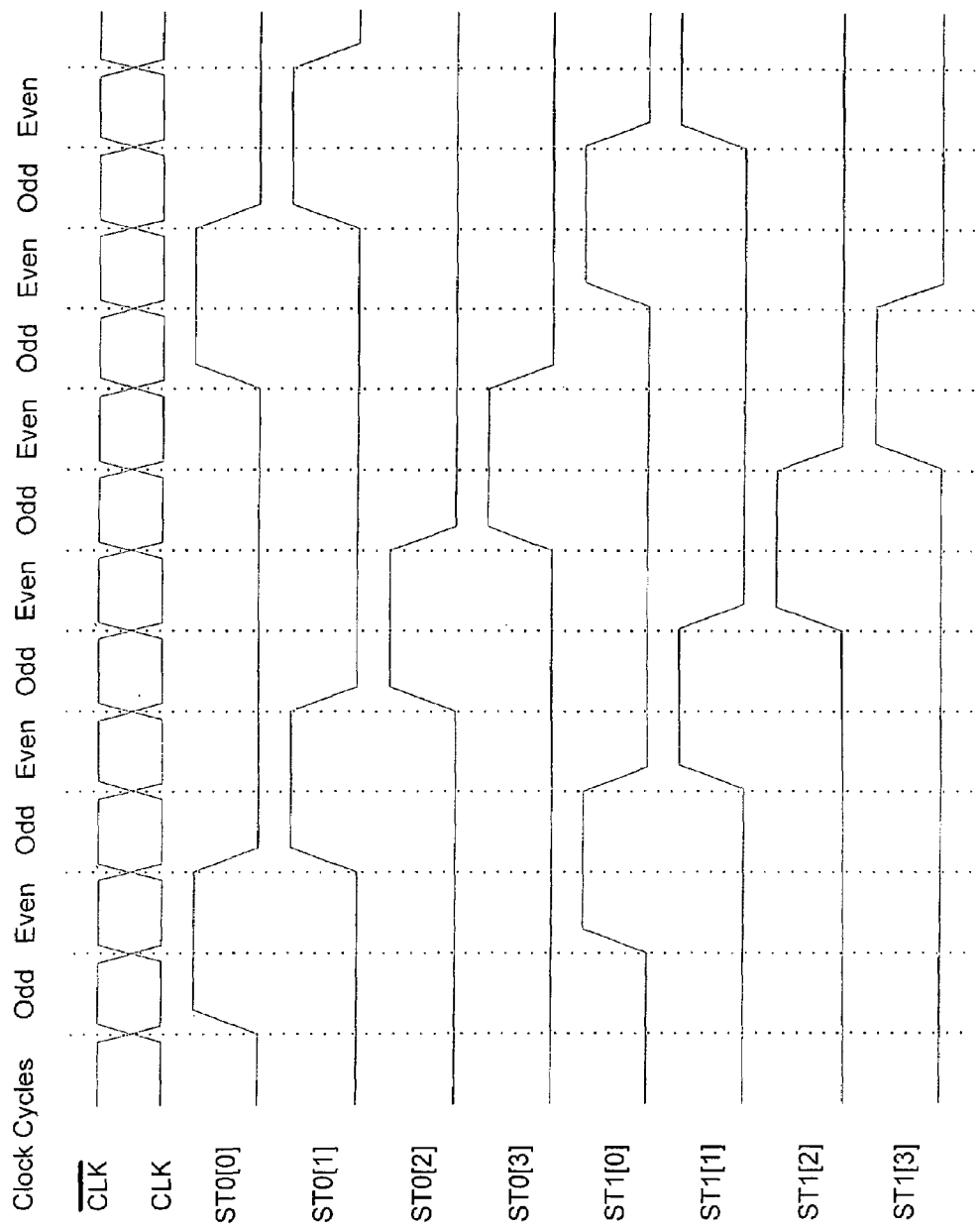
FIG. 13 illustrates the timing between the CLK signals and the two sets of four multiplexer control signals.

The bit lines 1235 and 1240 connect to the two-to-one multiplexer 1260. As described above, this multiplexer is controlled through the clock signal CLK and its complement. Accordingly, when the clock signals CLK and $\overline{\text{CLK}}$, and the sub-cycle signals, ST0[0]-ST0[3] and ST1[0]-ST1 [3] have the timing relationship illustrated in FIG. 13, the first tier multiplexer (formed by the transistors 1225) and the second tier multiplexer 1260 operate to output data from the storage elements 1225 at a rate that is twice the rate of the clock signal CLK.

As mentioned above, the circuit 325 and 330 of FIG. 12 can be used to provide data on a sub-cycle basis, or any other reconfiguration cycle basis. By building the first multiplexer stage into the sense amplifier section of the storage elements, this circuit reduces signal path delay from the storage elements. Also, it operates with storage elements that have less power consumption. Furthermore, it reduces power consumption by using NMOS transistors 1220 that are not driven by full voltage levels, and sharing the PMOS transistors 1205 and 1210 that are necessary for level conversion between two storage elements.

One of ordinary skill will realize that other embodiments might implement the two tiered circuit 325 and 330 differently. For instance, some embodiments might have one or more circuits 1245 between the multiplexer 1260 and the storage element section (i.e., the section with the storage elements 325 and their sense amplifiers).

VII. External Electronic System

Figure 14:
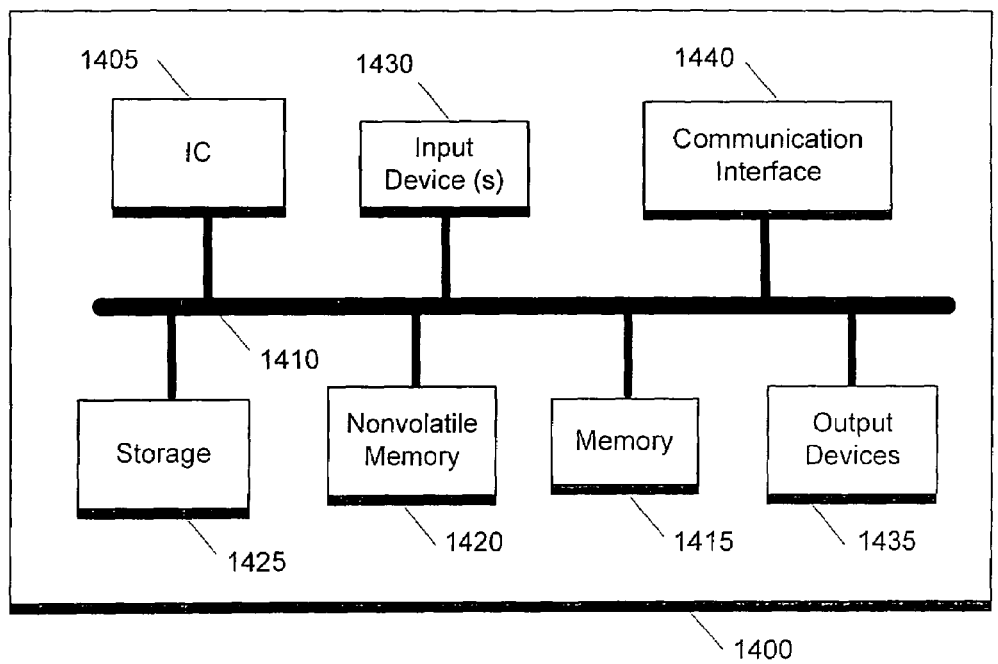
FIG. 14 illustrates an application electronic system which includes a configurable IC.

FIG. 14 conceptually illustrates an example of an electronic system 1400 that has an IC 1405, which includes one of the invention's configurable circuit arrangements that were described above. The system 1400 can be a stand-alone computing or communication device, or it can be part of another electronic device. As shown in FIG. 14, the system 1400 not only includes the IC 1405, but also includes a bus 1410, a system memory 1415, a nonvolatile memory 1420, a storage device 1425, input devices 1430, output devices 1435, and communication interface 1440.

The bus 1410 collectively represents all system, peripheral, and chipset interconnects (including bus and non-bus interconnect structures) that communicatively connect the numerous internal devices of the system 1400. For instance, the bus 1410 communicatively connects the IC 1405 with the nonvolatile memory 1420, the system memory 1415, and the permanent storage device 1425.

From these various memory units, the IC 1405 receives data for processing and configuration data for configuring the IC's configurable logic and/or interconnect circuits. When the IC 1405 has a processor, the IC also retrieves from the various memory units instructions to execute. The nonvolatile memory 1420 stores static data and instructions that are needed by the IC 1405 and other modules of the system 1400. The storage device 1425, on the other hand, is a read-and-write memory device. This device is a non-volatile memory unit that stores instructions and/or data even when the system 1400 is off. Like the storage device 1425, the system memory 1415 is a read-and-write memory device. However, unlike storage device 1425, the system memory is a volatile read-and-write memory, such as a random access memory. The system memory stores some of the instructions and/or data that the IC needs at runtime.

The bus 1410 also connects to the input and output devices 1430 and 1435. The input devices enable the user to enter information into the system 1400. The input devices 1430 can include touch-sensitive screens, keys, buttons, keyboards, cursor-controllers, microphone, etc. The output devices 1435 display the output of the system 1400.

Finally, as shown in FIG. 14, bus 1410 also couples system 1400 to other devices through a communication interface 1440. Examples of the communication interface include network adapters that connect to a network of computers, or wired or wireless transceivers for communicating with other devices. One of ordinary skill in the art would appreciate that any other system configuration may also be used in conjunction with the invention, and these system configurations might have fewer or additional components.

While the invention has been described with reference to numerous specific details, one of ordinary skill in the art will recognize that the invention can be embodied in other specific forms without departing from the spirit of the invention. For example, even though several embodiments are described above by reference to reconfigurable IC, one of ordinary skill will realize that the invention can be practiced in any type of configurable IC. Thus, one of ordinary skill in the art would understand that the invention is not to be limited by the foregoing illustrative details, but rather is to be defined by the appended claims.

What is claimed is:

1. An integrated circuit ("IC") comprising:
   a) a configuration memory for storing configuration data;
   b) error detection circuitry for (i) receiving configuration data from the configuration memory, (ii) detecting and correcting errors in the configuration data that fall within a first class of errors, and (iii) detecting errors in the configuration data that fall within a second class of errors and generating an uncorrectable error signal after detecting a second class error in order to indicate an uncorrectable error; and
   c) a configurable circuit for receiving the configuration data from the error detection circuitry.

2. The IC of claim 1 further comprising a circuit for resetting the IC when the error detection circuitry detects an uncorrectable error.

3. The IC of claim 1, wherein a circuit inside of the IC receives the uncorrectable error signal and, in response, loads new configuration data into the configurable IC, wherein the source of the new configuration data is from a source outside of the configurable IC.

4. The IC of claim 1, wherein a circuit inside of the IC receives the uncorrectable error signal and, in response, loads new configuration data into the configurable IC, wherein the source of the new configuration data is from a source inside of the configurable IC.

5. The IC of claim 1, wherein a circuit outside of the IC causes the IC to reset when the error circuitry detects an uncorrectable error.

6. The IC of claim 1, wherein a circuit outside of the IC receives the uncorrectable error signal and, in response, loads new configuration data into the configurable IC, wherein the source of the new configuration data is from a source outside of the configurable IC.

7. The IC of claim 1, wherein a circuit outside of the IC receives the uncorrectable error signal and, in response, loads new configuration data into the configurable IC, wherein the source of the new configuration data is from a source inside of the configurable IC.

8. The IC of claim 1, wherein the first class of errors includes errors of n bits, wherein $n \geq 1$.

9. The IC of claim 8, wherein the second class of errors includes errors of m bits, wherein $m > n$.

10. An electronic device comprising an integrated circuit ("IC"), said IC comprising:
    a) a configuration memory for storing configuration data;
    b) a configurable circuit for receiving the configuration data; and
    c) a configuration retrieval circuit for supplying the configuration data from the configuration memory to the configurable circuit, the configuration retrieval circuit comprising an error detection circuit for detecting whether the configuration data has an error before the configuration retrieval circuit supplies the configuration data to the configurable circuit.

11. The electronic device of claim 10, wherein the error correction circuit is further for outputting an uncorrectable error signal when the detected error is an uncorrectable error.

12. The electronic device of claim 11, wherein a circuit inside of the IC receives the uncorrectable error signal and, in response, loads new configuration data into the configurable IC, wherein the source of the new configuration data is from a source inside of the IC.

13. The electronic device of claim 11, wherein a circuit outside of the IC receives the uncorrectable error signal and, in response, loads new configuration data into the configurable IC, wherein the source of the new configuration data is from a source outside of the IC.

14. The electronic device of claim 10, wherein the error detection circuit is also an error correction circuit for correcting errors in the configuration data that fall within a first class of errors.

15. The electronic device of claim 14, wherein the first class of errors includes errors of n bits, wherein $n \geq 1$.

16. The electronic device of claim 15, wherein the error detection circuit is for detecting errors in the configuration data that fall within a second class of errors.

17. The electronic device of claim 16, wherein the second class of errors includes errors of m bits, wherein $m > n$.

18. An integrated circuit ("IC") comprising:
    a) a plurality of configuration storage elements for storing a plurality of configuration data sets;
    b) a reconfigurable circuit for receiving different configuration data sets in different clock cycles; and
    c) a multi-tier data transfer structure for transferring different configuration data sets to the reconfigurable circuit during different clock cycles, said multi-tier data transfer structure comprising at least one error detection circuit for determining whether a configuration data set includes an error.

19. The IC of claim 18,
wherein the multi-tier data transfer structure further comprises a first set of selection circuits and a second set of selection circuits;
wherein during a particular clock cycle, the first set of selection circuits supplies a configuration data set to the reconfigurable circuit for a particular clock cycle, while the second set of selection circuits pre-fetches a configuration data set to supply to the reconfigurable circuit during a clock cycle subsequent to the particular clock cycle.

20. The IC of claim 19,
wherein the multi-tier data transfer structure further comprises a plurality of error detection circuits between the first set of selection circuits and the second set of selection circuits;
wherein the plurality of error detection circuits are for determining whether the pre-fetched configuration data sets provided by the second set of selection circuits have errors before supplying the pre-fetched configuration data sets to the first set of selection circuits.

21. The IC of claim 19 wherein the error detection circuit is positioned after the first set of selection circuits to check whether the configuration data set output by the first set of selection circuits includes an error before supplying the configuration data set output by the first set of selection circuits to the reconfigurable circuit.

22. The IC of claim 21 wherein the multi-tier data transfer structure further comprises a retiming circuit after the error detection circuit for receiving the configuration data set from the error detection circuit and retiming the configuration data set to make the configuration data set synchronous with the operation of the reconfigurable circuit before providing the configuration data set to the reconfigurable circuit.

\* \* \* \* \*

UNITED STATES PATENT AND TRADEMARK OFFICE
CERTIFICATE OF CORRECTION

PATENT NO. : 7,669,097 B1 Page 1 of 1
APPLICATION NO. : 11/391000
DATED : February 23, 2010
INVENTOR(S) : Teig et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 377 days.

Signed and Sealed this

Twenty-eighth Day of December, 2010

David J. Kappos
*Director of the United States Patent and Trademark Office*